US006453435B1

(12) United States Patent
Limon, Jr. et al.

(10) Patent No.: US 6,453,435 B1
(45) Date of Patent: Sep. 17, 2002

(54) METHOD AND APPARATUS FOR AUTOMATED TESTING OF CIRCUIT BOARDS

(75) Inventors: Rogelio Limon, Jr., Mesquite, TX (US); John T. Riley, Allen, TX (US); Robert A. Beasley, Dallas, TX (US)

(73) Assignee: Fujitsu Network Communications, Inc., Richardson, TX (US)

( * ) Notice: Subject to any disclaimer, the term of this patent is extended or adjusted under 35 U.S.C. 154(b) by 0 days.

(21) Appl. No.: 09/222,541

(22) Filed: Dec. 29, 1998

(51) Int. Cl.[7] .................................... G01R 31/28
(52) U.S. Cl. .................................... 714/724
(58) Field of Search ............................ 714/724, 745

(56) References Cited

U.S. PATENT DOCUMENTS 4,718,064 A * 1/1988 Edwards et al. .............. 714/28
4,760,330 A * 7/1988 Lias, Jr. ....................... 714/32
4,901,221 A * 2/1990 Kodosky et al. ............ 345/348
5,045,994 A * 9/1991 Belfer et al. .................. 703/25
5,432,705 A * 7/1995 Severt et al. ............... 702/120
5,511,108 A * 4/1996 Severt et al. ................. 379/21
5,974,257 A * 10/1999 Austin ........................... 717/8

OTHER PUBLICATIONS

Measure Serial Control User Manual, National Instruments Corporation, Aug. 1996.*
TestStand User Manual, National Instruments Corporation, Dec. 1998.*

* cited by examiner

*Primary Examiner*—Albert Decady
*Assistant Examiner*—Joseph D. Torres
(74) *Attorney, Agent, or Firm*—Baker Botts L.L.P.

(57) ABSTRACT

A test station is provided to test a circuit board unit. The test station includes a disk drive storing uncompiled files which are interpretatively processed in order to carry out test operations. A bar code reader can scan a label on the unit, in order to accurately identify the unit. The label information can be used to ensure accurate programming of any programmable devices on the unit, and accurate selection of the correct test definition files for the unit. Step-by-step instructions can be provided to an operator regarding every manual act required during a test definition, and can include a graphic image of each such manual act. The test station can have two different test modes, where at least one command of the test definition is carried out for one mode but not the other. The test station has a debug mode, which includes capabilities for breakpoints, step mode, dynamic alteration of test definitions, and dynamic observation and alteration of variables.

27 Claims, 9 Drawing Sheets

METHOD AND APPARATUS FOR AUTOMATED TESTING OF CIRCUIT BOARDS

STATEMENT REGARDING COPYRIGHT RIGHTS

A portion of this patent disclosure is material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD OF THE INVENTION

This invention relates generally to testing of units such as electronic circuit boards and, more particularly, to computerized systems for automated testing of such units.

BACKGROUND OF THE INVENTION

Over the years, as integrated circuits have become progressively more complex and sophisticated, electronic circuit boards which use these integrated circuits have also become progressively more complex and sophisticated. Consequently, in order to accurately test these electronic circuit boards, more and more sophisticated techniques have been required. In particular, circuit board manufacturers have decreased the use of manual testing techniques in favor of automated and computerized testing techniques. A resulting problem is the efficient development of test definitions, which are stored by the test system and which are then automatically carried out in order to effect testing.

A traditional approach has been to prepare a custom computer program which implements a test definition, and to then compile the program into an executable object code file, which is executed in order to carry out the required sequence of test operations. While this approach has been generally adequate for its intended purposes, it has not been entirely satisfactory in all respects. For example, in order to prepare a test definition, a test developer must be highly proficient in a sophisticated computer programming language such as assembly language, and there is thus a steep learning curve and a significant amount of training required in order for a person to obtain the minimum skills required to develop even a simple test definition. Further, each test definition may require the development of auxiliary routines, such as special low-level instrument drivers, special data logging routines, and so forth. Different test developers may prefer different languages, which makes it difficult for one test developer to quickly comprehend a program developed by another test developer, even when the source code is readily available.

Test definitions written in a selected language will typically require certain hardware-specific characteristics, such as device addresses, to be embedded therein. This limits the portability of a given test definition between various different test systems that are theoretically capable of testing the same circuit board, at least without significant time and effort to effect revisions. Because the programs are compiled, it is difficult to debug and troubleshoot the programs during development, and it is relatively cumbersome to adjust the test definitions when faced with a uniquely elusive problem in a particular circuit board. Due to the steep learning curve and the significant training time required to become proficient in a computer programming language, the operators who ultimately use the test system to test production boards will typically not be given such training. Consequently, they will simply run the specified test definitions without fully understanding what the tests are doing.

Another consideration is that it is difficult to train an operator to accurately conduct tests on a variety of different types of units, because it becomes more and more difficult for the operator to remember each of the various sequences of manual steps which must be carried out for each of the respective different types of units. For example, it may be necessary to connect an optical cable to one type of unit, but not to connect any such cable to a different type of unit. It is possible for an operator to inadvertently select the wrong test definition for use in testing a given circuit board. In a situation where a circuit board .has a programmable part which must be programmed, it is possible for an operator to inadvertently select the wrong information for use in programming the programmable part. There is also a need to be able to easily switch between a normal level of testing and a more rigorous level of testing, without necessarily requiring the operator to select one of two different test definitions, and without requiring a test developer to develop two entirely separate test definitions for the same unit.

SUMMARY OF THE INVENTION

From the foregoing, it may be appreciated that a need has arisen for automated test techniques in which test definitions are represented in a form that is intuitive and requires minimal training, which has features facilitating debug and dynamic alteration of test definitions, which can provide an operator with step-by-step instructions for manual acts required by each test definition, which permits a single test definition to selectively carry out different levels of testing, which automates the selection of test definitions, and/or which automates the selection of information that is to be programmed into a programmable part on a unit under test.

According to one form of the present invention, a technique is provided to address this need, and involves a test station which includes: a coupling portion operative to facilitate a detachable operative coupling of the test station to a unit to be tested; a memory portion which stores a program and a test file, the test file containing a test definition which specifies at least one test operation to be carried out by the test station through the coupling portion, the test definition being in the form of at least one command which is in an operator perceptible, uncompiled format; and a processor portion operatively coupled to the memory portion and the coupling portion, the processor portion being operative to execute the program, and the program causing the processor portion to process commands in the test file in an interpretive manner so as to cause the test definition to be carried out.

Another form of the invention involves a test station which includes: a coupling portion operative to facilitate a detachable operative coupling of the test station to a unit to be tested; a memory portion which stores a program and a test definition, the test definition including a first portion and a second portion, the first portion specifying a first test operation to be carried out by the test station through the coupling portion and the second portion specifying a second test operation to be carried out by the test station through the coupling portion; and a processor portion operatively coupled to the memory portion and the coupling portion, the processor portion being operative to execute the program, wherein the program causes the processor portion to permit an operator to selectively specify one of a first operational mode and a second operational mode, and causes the processor portion to access and process the test definition, wherein in the first operational mode the processor portion processes both the first portion and the second portion of the test definition so as to carry out both of the first and second test operations, and wherein in the second operational mode the processor portion processes only the first portion of the test definition to the exclusion of the second portion thereof so as to carry out only the first test operation without the second test operation.

Yet another form of the invention involves a test station which includes: a coupling portion operable to facilitate a detachable operative coupling of the test station to a unit to be tested; an output portion through which information can be communicated to an operator; a memory portion which stores a test definition; and a processor portion operatively coupled to the coupling portion, the memory portion, and the output portion, the processor portion being operative in response to the test definition to use the output portion to successively communicate to an operator each of a plurality of different manual steps which are needed to carry out the test definition.

Still another form of the invention involves a test station which includes: a coupling portion operable to facilitate a detachable operative coupling of the test station to a unit to be tested; an output portion through which information can be communicated to an operator, the output portion including a video display; a memory portion which stores a test definition; and a processor portion operatively coupled to the coupling portion, the memory portion, and the output portion, the processor portion being operative in response to the test definition to display on the video display a graphic depiction of how to perform a manual step required by the test definition.

A further form of the invention involves a method of operating a test station which can be detachably operatively coupled to a test unit to be tested, including: storing a test definition; and causing the test station to respond to the test definition by automatically carrying out on the test unit a sequence of test operations specified by the test definition, and by presenting on a display a graphic depiction of how to perform a manual step required by the test definition.

Yet another form of the present invention involves a test station which includes: a coupling portion operative to facilitate a detachable operative coupling of the test station to a test unit which has indicia thereon; a reader portion which can read the indicia on the unit; and a control portion which is operatively coupled to the coupling portion and the reader portion, the control portion being responsive to information obtained through the reader portion for carrying out through the coupling portion at least one operation which is selected as a function of the information.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
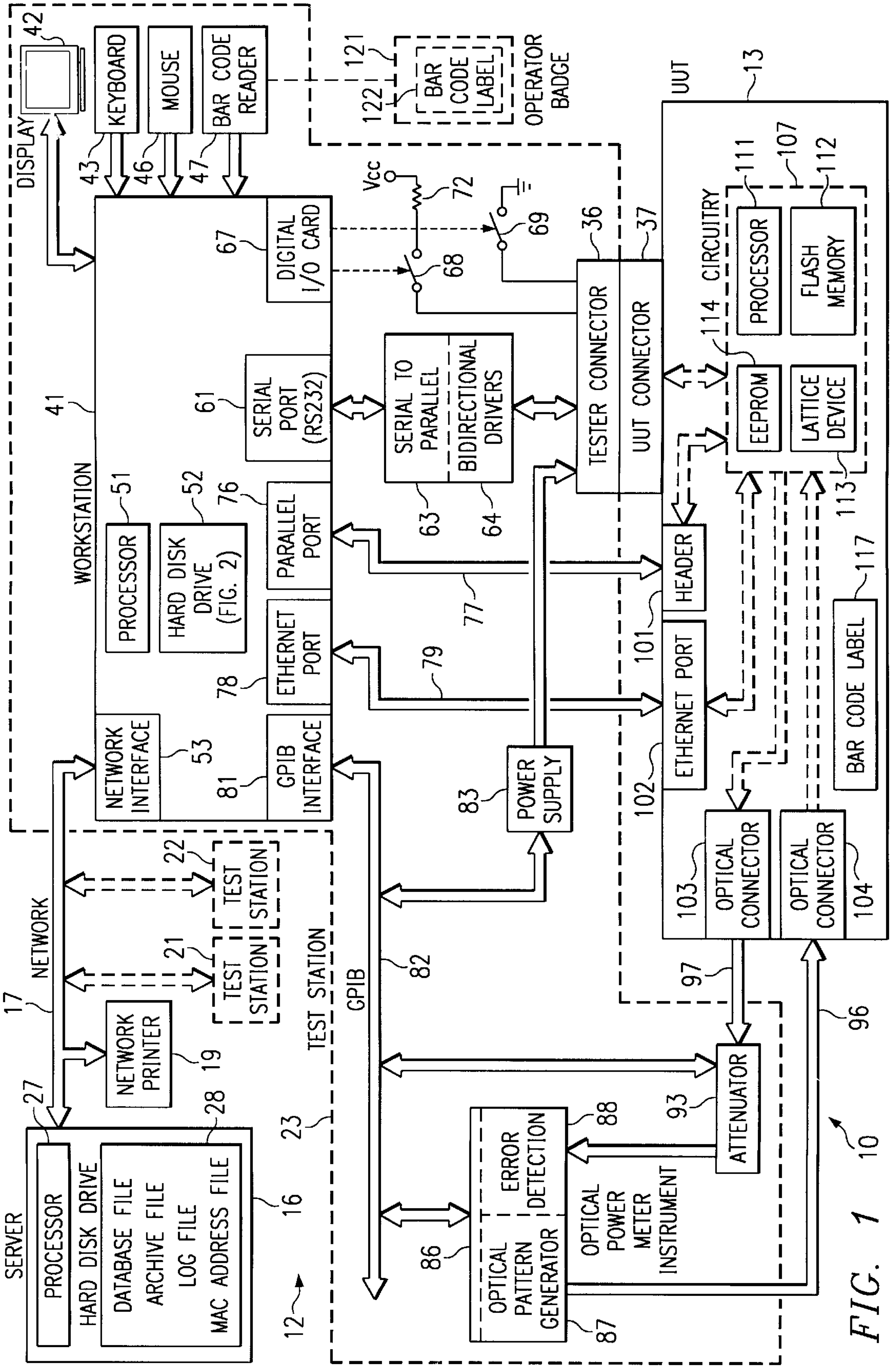
FIG. 1 is a block diagram of an apparatus which includes an automated test system that embodies the present invention.

FIG. 1 is a block diagram of an apparatus 10 which embodies the present invention, and which includes a test system 12 capable of testing a unit under test (UUT), one exemplary UUT being shown at 13. The exemplary UUT 13 shown in FIG. 1 is a telecommunications circuit board of a type commonly known as an optical board. However, the system 12 is also capable of testing a variety of other types of circuit boards.

The test system 12 includes a server 16 which is coupled through a network 17 to a network printer 19 and a plurality of test stations 21–23. The network 17 may be any of several different types of networks which are commercially available, and is therefore not described here in detail. The test stations 21–23 are equivalent to each other, and therefore only the test station 23 is illustrated and described in detail.

The server 16 includes a processor 27, which in the disclosed embodiment is a commercially available microprocessor. The server 16 also includes a hard disk drive 28. The hard disk drive 28 stores an operating system to be executed by the processor 27, as well as application programs which can be executed by the processor 27. In addition, and as indicated in FIG. 1, the hard disk drive 28 stores a database file, an archive file, at least one log file, and a MAC address file, the operational purposes of which are addressed later.

The test station 23 includes a tester connector 36, to which can be releasably coupled a UUT connector 37 that is provided on tile UUT 13. The test station 23 further includes a workstation 41, which in the disclosed embodiment is a commercially available computer of the type commonly known as a personal computer. It is coupled to a cathode ray tube (CRT) display 42, a keyboard 43, and a mouse 46, which permit a human operator to interface with the workstation 41, and to conduct tests in a manner described in more detail later. A bar code reader 47 is coupled to the workstation 41. In the disclosed embodiment, the bar code reader 47 is a hand-held unit which is coupled to the workstation 41 by a cable that is several feet long. However, the bar code reader 47 could alternatively be a stationary device.

The workstation 41 includes a processor 51, which is a commercially available microprocessor, and includes a hard disk drive 52. The directory organization of the hard disk drive 52, and certain files stored thereon, are discussed in more detail later with reference to FIG. 2. The processor 51 executes a commercially available operating system, which in the disclosed embodiment is the operating system available from MicroSoft Corporation of Redmond, Washington under the tradename WINDOWS 95. The operating system is not shown in the drawings, but is stored on the hard disk drive 52. The workstation 41 includes a network interface card 53, which is a commercially available part, and which couples the workstation 41 to the network 17.

The workstation 41 has a standard RS232 serial port 61, which is coupled to a serial-to-parallel conversion circuit 63 disposed in the test station 23. The circuit 63 is in turn coupled to a plurality of bidirectional drivers 64 that are coupled to the test connector 36. The workstation 41 also includes a digital input/output (I/O) card 67, which is a commercially available plug-in card.

The test station 23 includes a plurality of electronic switches, two of which are shown at 68 and 69. The test station 23 includes a plurality of the switches 68 and also a plurality of the switches 69, but for clarity and convenience only one switch 68 and one switch 69 are shown in FIG. 1. The switch 69 has one end coupled to ground, and the switch 68 has one end coupled to a pull-up resistor 72, the other end of the resistor being coupled to a supply voltage. The opposite end of each of the switches 68 and 69 is coupled to a respective terminal of the tester connector 36. The switches 68 and 69 are each operatively controlled by the digital I/O card 67, as shown diagrammatically by broken lines in FIG. 1.

The workstation 41 includes a standard bidirectional parallel port 76, and the test station 23 includes a parallel cable 77 which is coupled at one end to the parallel port 76, and which can be releasably coupled at its other end to the UUT 13. The workstation 41 further includes standard circuitry providing a network port 78, such as that commonly known by the tradename ETHERNET. The test station 23 includes a network cable 79 which has one end coupled to the ETHERNET port 78, and which can be releasably coupled at its other end to the UUT 13.

The workstation 41 includes a circuit 81, which is a General Purpose Interface Bus (GPIB) interface circuit, and which interfaces the workstation 41 to a GPIB bus 82. The GPIB bus 82 and the interface circuit 81 conform to an industry standard specification known as the General Purpose Interface Bus specification. Accordingly, bus 82 and circuit 81 are not described here in detail.

The test station 23 includes a power supply 83, which is coupled to the GPIB bus 82, so that the power supply 83 can be controlled by the workstation 41 through the GPIB bus 82. The power supply 83 has outputs which are coupled to the tester connector 36, so that the power supply 83 can supply power to the UUT 13.

The test station 23 also includes an optical power meter instrument 86, which has inputs coupled to the GPIB bus 82, so that the workstation 41 can control the optical power meter instrument 86 through the GPIB bus 82. The optical power meter instrument 86 includes an optical pattern generator portion 87, and an error detection portion 88. The test station 23 further includes an optical attenuator 93, which has inputs coupled to the GPIB bus 82, so that the workstation 41 can control the attenuator 93 through the GPIB bus 82. The attenuator 93 is operably coupled to the error detection portion 88 of the optical power meter instrument 86. An optical cable 96 has one end coupled to the optical pattern generator 87, and its other end can be detachably coupled to the UUT 13.

A further optical cable 97 has one end coupled to the attenuator 93, and its other end can be detachably coupled to the UUT 13.

The UUT 13 is a circuit board, which has thereon a header 101, to which an end of the parallel cable 77 can be releasably coupled, and circuitry 102 defining a network port which includes a connector to which one end of the network cable 79 can be releasably coupled. The UUT 13 further includes an optical connector 103 to which one end of the optical cable 97 can be releasably coupled, and a further optical connector 104 to which one end of the optical cable 96 can be releasably coupled. The UUT 13 has circuitry 107 thereon, which is electrically coupled to the UUT connector 37, the header 101, and the network port 102. The circuitry 107 includes one or more electro-optical devices, which operatively couple the circuitry 107 to the optical connectors 103 and 104.

The circuitry 107 includes a processor 111 which is a microprocessor of a commercially available type. The circuitry 107 further includes three programmable devices 112, 113 and 114. In the disclosed embodiment, the device 112 is a flash memory, the device 113 is a lattice device, and the device 114 is an Electrically Erasable Programmable Read Only Memory (EEPROM), but the devices 112–114 could alternatively be other types of programmable devices. The UUT 13 has thereon a label 117, which has indicia in the form of a bar code on it, and possibly some other indicia. The bar code on the label 117 provides information such as a board number and part number, and also a serial number. The board number and part number have a one-to-one relationship to each other, and define a particular type of board. In contrast, the serial number is a unique number provided for each board of a particular type. If the part number of the manufacturer is different from the part number of a customer, the bar code on label 117 could also optionally include the customer part number, as a convenience to the customer.

The particular UUT 13 shown in FIG. 1 is one particular type of circuit board, which has been selected for the sake of example. In particular, and as mentioned above, the UUT 13 is a telecommunications circuit board of a type commonly known as an optical board. However, the test station 23 is designed to be capable of testing a variety of different types of circuit boards, which may each have a larger or smaller number of components than the UUT 13 shown in FIG. 1. For example, other boards may lack the optical connectors 103 and 104, or may lack programmable devices such as those shown at 112-114. Each operator has an identification badge or card, one of which is shown at 121. The badge 121 has a bar code label 122 on it. The bar code label 122 includes information which identifies the particular operator, such as a name and/or employee number. Although it would be possible for each operator to manually enter this information, use of a machine-readable card or badge reduces the chance of-inadvertent errors by the operator.

Figure 2:
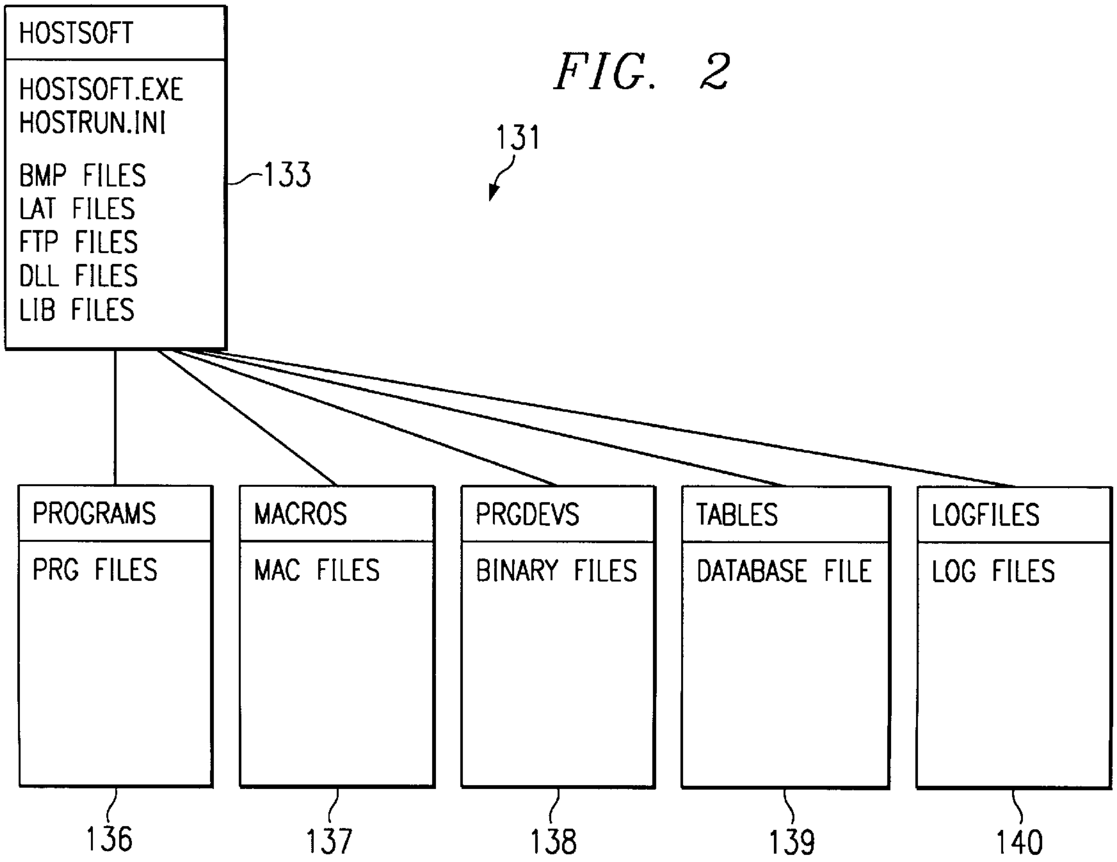
FIG. 2 is a block diagram of part of a directory structure for a hard disk which is a component of the test system of FIG. 1.

FIG. 2 is a diagrammatic view of a directory structure 131, which is a portion of the overall directory structure present on the hard disk drive 52 of the workstation 41 (FIG. 1). The directory structure 131 includes a HostSoft subdirectory 133. The HostSoft subdirectory 133 has several additional subdirectories associated with it, including a Programs subdirectory 136, a Macros subdirectory 137, a PrgDevs (programmable devices) subdirectory 138, a Tables subdirectory 139 and a LogFiles subdirectory 140.

The term "HostSoft" is used herein as the name of a subdirectory, and as the name of an executable program file. However, the term HOSTSOFT is also a trademark of the assignee of the present application, for use in commerce in association with products disclosed herein.

FIG. 2 identifies some of the most relevant files which are stored in the subdirectories 133 and 136–140, but it will be recognized that each of these subdirectories may include additional files. The subdirectory 133 includes a file HostSoft.EXE, which is a compiled program that is executed by the processor 51 of the workstation 41 in conduction with execution of the resident operating system, and which provides underlying control for test operations carried out by the test station 23. The subdirectory 133 also includes a file HostRun.INI, which is an initialization file described in more detail later. The subdirectory 133 includes several additional files which each include a graphics image in a standard "bit-map" format, and which are each identified by a respective filename ending in the common extension "BMP".

The subdirectory 133 also includes several lattice configuration files, which each have a respective filename that ends with the common extension "LAT", and includes several file transfer protocol (FTP) configuration files, which each have a respective filename that ends with the common extension "FTP". Specific examples of a LAT file and an FTP file are described later. The subdirectory 133 further includes several library files, which have respective filenames that end with the common extension "LIB", and several dynamic link library files which have respective filenames that end with the common extension "DLL". The LIB and DLL files are compiled object-code files, as discussed later.

The Programs subdirectory 136 includes several program files, which each have a respective filename ending in the common extension "PRG". The Macros subdirectory 137 includes several macro files, which each have a respective filename ending in the common extension "MAC". Specific examples of a PRG file and several MAC files are discussed later. The PrgDevs subdirectory 138 includes several binary files, which each include binary information that can be loaded into a programmable device, such as one of the programmable devices shown at 112–114 in FIG. 1. The Tables subdirectory 139 includes a database file, which is discussed in more detail later. The LogFiles subdirectory 140 includes at least one log file, which is used to store the results of certain test operations, in a manner described later.

As mentioned above, the Programs subdirectory 136 includes a plurality of PRG files, and the macro subdirectory 137 includes a plurality of MAC files. Each type of unit to be tested is associated with a respective PRG file, which defines the sequence of test operations that are to be conducted on each unit of that type. The PRG file may call one or more MAC files, in a manner somewhat similar to the manner in which a subroutine is called by a computer program. Each MAC file can call one or more other MAC files in a similar manner. There is no significant difference between a PRG file and a MAC file. A PRG file is simply a MAC file which contains the top level of the test definition, and each MAC file contains a portion of the test definition at a greater level of detail.

The PRG files and the MAC files are all maintained in an uncompiled operator-perceptible format. In more detail, each PRG file or MAC file in the disclosed embodiment is an ASCII text file, which contains a command sequence that includes one or more commands drawn from a predefined set of commands. Table 1 lists all of the commands in this predefined command set, and provides a brief summary of each command. To avoid unnecessary duplication, the various commands are not all described again in detail here. However, some specific comments are offered in the interest of clarity.

First, some of the commands in Table 1 refer to a "MAC address", which is an industry-standard type of network address. It is not necessary to discuss the MAC addresses in detail here. However, it is important to point out that the present discussion refers to macro files, and some macro files have filenames which end with the extension "MAC", and which are referred to herein as MAC files.

References to the MAC files should not be confused with references to the MAC addresses, because they are entirely different.

Second, the commands set forth in Table 1 can support different types of variables, including integer variables, floating point variables, and string variables. The 3G HostSoft.EXE program is written so as to effect automatic conversion between variable types. Thus, for example, if one of the commands in Table 1 is expecting a variable value of a floating-point type, but receives a variable value of an integer type, it will automatically convert the integer value to a floating-point value, and then continue.

Third, some of the commands in Table 1 refer to a "generic message" or a "generic result". The format for each such command ends with one or more parameters which are disposed within square brackets in the command definition. The square brackets indicate that the parameters within them are optional. Depending on whether or not these parameters are present in a given command, the command will be carried out in either a data mode or a measurement mode.

The measurement mode is in effect if the optional parameters are present. The optional parameters include a "test flag" parameter, which affects how the command operates. More specifically, if the test flag parameter is a "P" for "pass", then the system will display a specified message and the word "PASS" on the display 62 if the specified operation is successful, but will display nothing if the specified operation fails. If the test flag parameter is an "F" for "fail", then the system will display the specified message and the word "FAIL" if the specified operation fails, but will display nothing if the specified operation is successful. If the test flag parameter is an "A" for "always", then the system will always display the specified message, and will also display either the word "PASS" or the word "FAIL" in dependence on whether the specified operation was successful or not.

If the optional parameters are not provided, then the command is carried out in the data mode. Data mode is used to collect information from a device for the purpose of either displaying it or evaluating it later. That is, the command simply returns data to the screen or to a variable. Table 2 sets forth one specific example of a PRG file, which, has the name "3MR1.PRG". This specific PRG file was prepared to test an optical board of the type shown at 13 in FIG. 1. This PRG file calls several MAC files, some of which call other MAC files. In total, processing of the PRG file in Table 2 requires ten related MAC files, which are respectively set forth in Tables 3–12. Tables 2–12 are self-explanatory when read in conjunction with the definition of the command set provided in Table 1. Nevertheless, an overview explanation of these files is given later for purposes of convenience.

When the compiled program HostSoft.EXE is interpreting the PRG file of Table 2, or one of the MAC files of Tables 3–12, it reads a line, and then parses and processes that line on the fly in an "interpretative mode", in order to implement the command. The HostSoft.EXE program then reads the next line, and processes that next line in the interpretative mode. The present invention is not limited to the specific set of commands set forth in Table 1, nor to the specific PRG and MAC files set forth in Tables 2–12. Instead, Tables 1–12 are provided to show one example of a test definition according to the present invention, in order to facilitate a better understanding of the present invention. The PRG and MAC files in Tables 2–12 are discussed in more detail later.

When the workstation 41 is turned on, it will automatically initiate execution of the resident operating system, which as mentioned above may be the window-based operating system available under the tradename WINDOWS 95. Then, through use of the keyboard 43 or mouse 46, the operator can instruct the operating system to cause the processor 51 to begin execution of the compiled HostSoft.EXE program located in the HostSoft subdirectory 133.

During this turn-on or initialization process, information will be downloaded from the server 16 to the test station 23. More specifically, the database file on the hard disk drive 28 of the server 16 will be downloaded to the Tables subdirectory 139 on the hard disk drive 52 of the test station 23. Further, the archive file on the hard disk drive 28 of the server 16 will be accessed, and appropriate files therefore will be extracted from the archive file and downloaded to appropriate subdirectories 113 and/or 136–138 on the hard disk drive 52 of the test station 23. This may include any or all of the above-discussed INI, BMP, LAT, FTP, DLL, LIB, PRG, MAC and binary files. In the disclosed embodiment, some of these files are downloaded in conjunction with start-up of the operating system, and others are downloaded if and when the HostSoft program is started. However, it will be recognized that all files could be downloaded at the same time.

Figure 3:
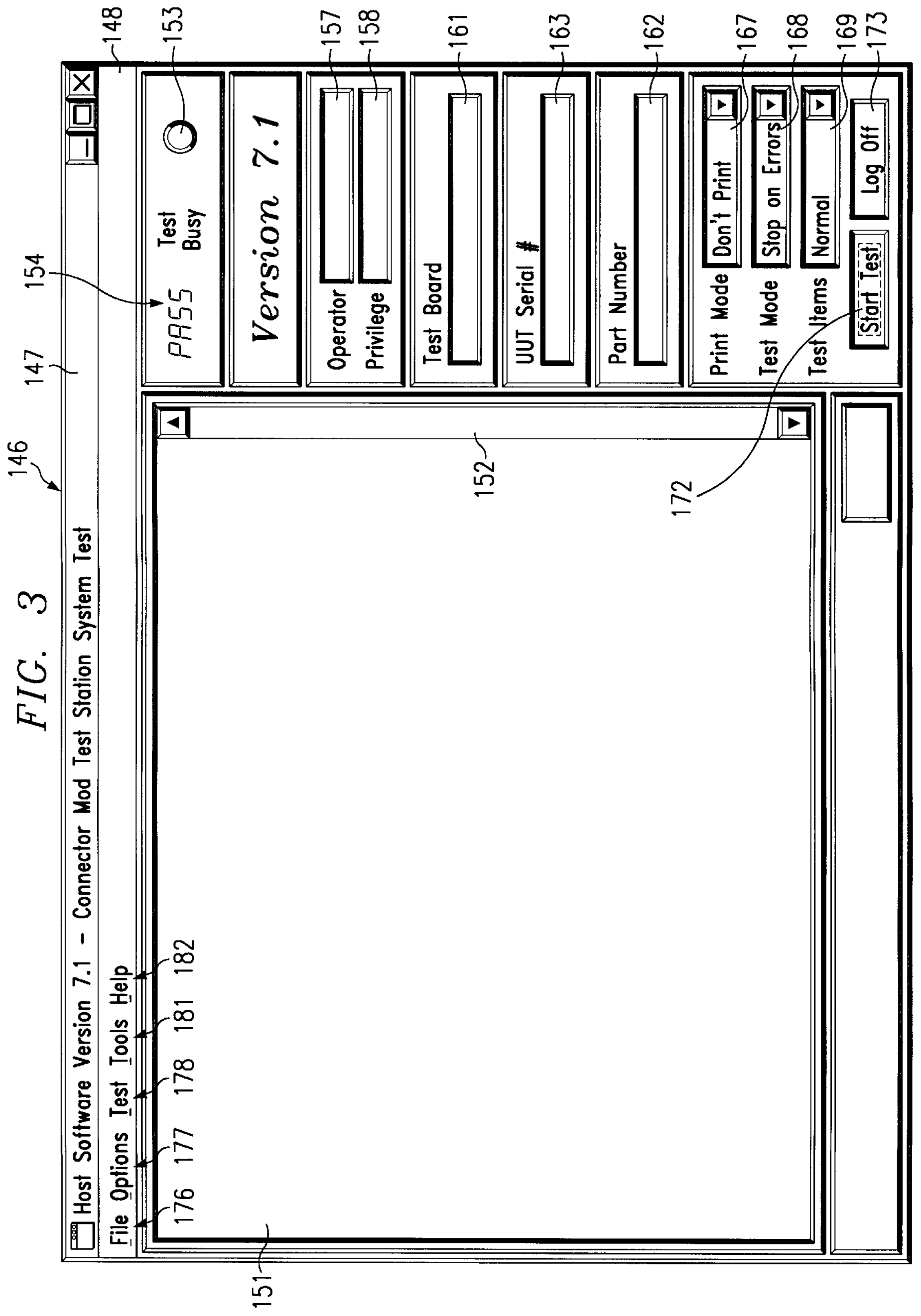
FIG. 3 is a diagrammatic view of a main screen provided on a visual display which is a component of the test system of FIG. 1.

As soon as the HostSoft.EXE program is started, it will generate and present on the display 42 a window containing a main screen, which is shown at 146 in FIG. 3. The main screen 146 is a window having at the top a title bar 147, which has an industry-standard format. In particular, the icons at the right and left ends of the title bar 147 may be used to resize or to close the window which contains the main screen 146. Immediately below the title bar 147 is a menu bar 148, which is described in more detail later. Below the menu bar 148, on the left side of the screen, is a workspace 151, which can be used to display information to the operator, including information received from the operator. At the right side of the workspace 151 is a scroll bar 152 of standard format, which permits the operator to scroll up and down through the information present in the workspace 151.

Below the menu bar 148, on the right side of the screen, is a Test Busy indicator 153. The Test Busy indicator 153 is a portion of the screen which is selectively presented at different times in one of two different colors, such as gray and red, in order to indicate that the indicator is respectively off and on. Adjacent the Test Busy indicator 153 is a PASS indicator 154, which can also be displayed in one of two different colors, such as black and green, to show that the indicator 154 is respectively off and on. The Test Busy indicator 153 is turned on when the test station 23 is conducting a test on a unit such as the UUT 13. If the unit passes all of the tests conducted on it, then at the completion of the test sequence, the PASS indicator 154 is turned on in order to indicate to the operator that the unit successfully passed all tests.

Below the indicators 153 and 154 is a region 157, where the name of the current operator is displayed, and a region 158, which displays the privilege levels enjoyed by the current operator. Some operators will have a wider range of privileges than other operators. For example, one operator may be permitted to run predefined tests on units which are to be tested, but may not have the privilege to make any changes to those tests. In contrast, an operator with a higher privilege level may be able to not only run the predefined tests, but to also dynamically alter them.

Below the regions 157 and 158 are three further regions 161–163, where the system displays information regarding the unit which is currently being tested. In particular, in region 161, the system displays an alphanumeric "Test Board" name for the specific type of unit currently being tested. In the region 162, the system displays a part number for that type of unit. In general, there will be a one-to-one relationship between the test board name and the part number. In region 163, the system displays a serial number, where there is a unique serial number for each unit of a given type. That is, if there are one hundred units of the same type, they will each have the same test board name and part number, but each will have a different serial number.

Below the part number region 162 are three drop-down lists 167, 168 and 169, which can be used by the operator to selectively control certain aspects of system operation. The drop-down list 167 is used to select the "Print Mode", which determines what information, if any, will be printed on the network printer 19 (FIG. 1) by the test station 23. The three available options for print mode are "Don't Print", "Print On Errors" and "Always Print", which are self-explanatory.

The drop-down list 168 is used to select the "Test Mode". The two available Test Mode options are "Stop On Errors" and "Continue On Errors", which specify whether or not the system is to continue if it detects an error while conducting a test.

The third drop-down list 169 is used to select the "Test Items", which allows the operator to specify how rigorously a particular unit should be tested. The two available options are "Normal" and "Sample Base". The "Sample Base" option is typically used to cause more rigorous testing to be carried out than the "Normal" option, in a manner which is described in more detail later. Units will usually be tested under the "Normal" option. The "Sample Base" option might be periodically selected in order to effect more rigorous testing of a few units for quality control purposes, for example once per week or once per month. Alternatively, if a particular unit has exhibited problems in the field but appears to pass all tests conducted under the "Normal" option, the "Sample Base" option might be selected in order to effect more rigorous testing of that particular unit, in an attempt to identify and localize the problem.

Two buttons 172 and 173 are provided below the drop-down list 169. The button 172 is a "Start Test" button, which can be actuated in order to initiate a selected test, in a manner described later. The button 173 is used to toggle between "Log On" and "Log Off" modes of operation, in which test results are and are not saved to a log file in the LogFiles subdirectory 140 (FIG. 2), as discussed later.

Turning now in more detail to the menu bar 148, the menu bar identifies five drop-down menus, which are the File Menu 176, Options Menu 177, Test Menu 178, Tools Menu 181, and Help Menu 182. The Help Menu 182 provides on-line help in a generally standard manner, and is not described in detail here. As to the other drop-down menus, the most pertinent options from each menu will be described, but it will be recognized that these menus may each have additional options which are not described here. The File Menu 176 has an "Open Macro" option, which opens a special window that will be described in more detail later in association with FIG. 8. The File Menu also has "Exit" option, which causes the test station 23 to terminate execution of and exit from the HostSoft.EXE program.

The Options Menu 177 has a "View Pictures" option, which toggles on and off a view pictures capability, which is described in more detail later. The Options Menu also has a "Debug Mode" option, which toggles on and off whether the system is operating in a special debug mode, which will be described in more detail later. The Options Menu also includes a "Step Mode" option, which toggles on and off a special mode of operation which is called the step mode, and which is described in more detail. Further, the Options Menu includes a "Log Test Results" option, which is a toggle that determines whether or not the test station 23 saves certain test results to a log file located in the LogFiles subdirectory 140 (FIG. 2). The "Log Test Results" option is functionally equivalent to the button 173, which was discussed above.

The Test Menu 178 includes a "Start Test" option, which is equivalent to the above-discussed Start Test button 172. The Test Menu further includes a "Cancel Test" option, which immediately terminates a currently running test prior to normal completion thereof. Further, the Test Menu includes a "Select Macro To Run" option, which is discussed in more detail later.

The Tools Menu 181 has an "RS232 Spy" option and a "GPIB Spy" option, each of which toggles on and off a special facility that can be used to view information going to and from a unit being tested, in a manner discussed later.

Figure 4:
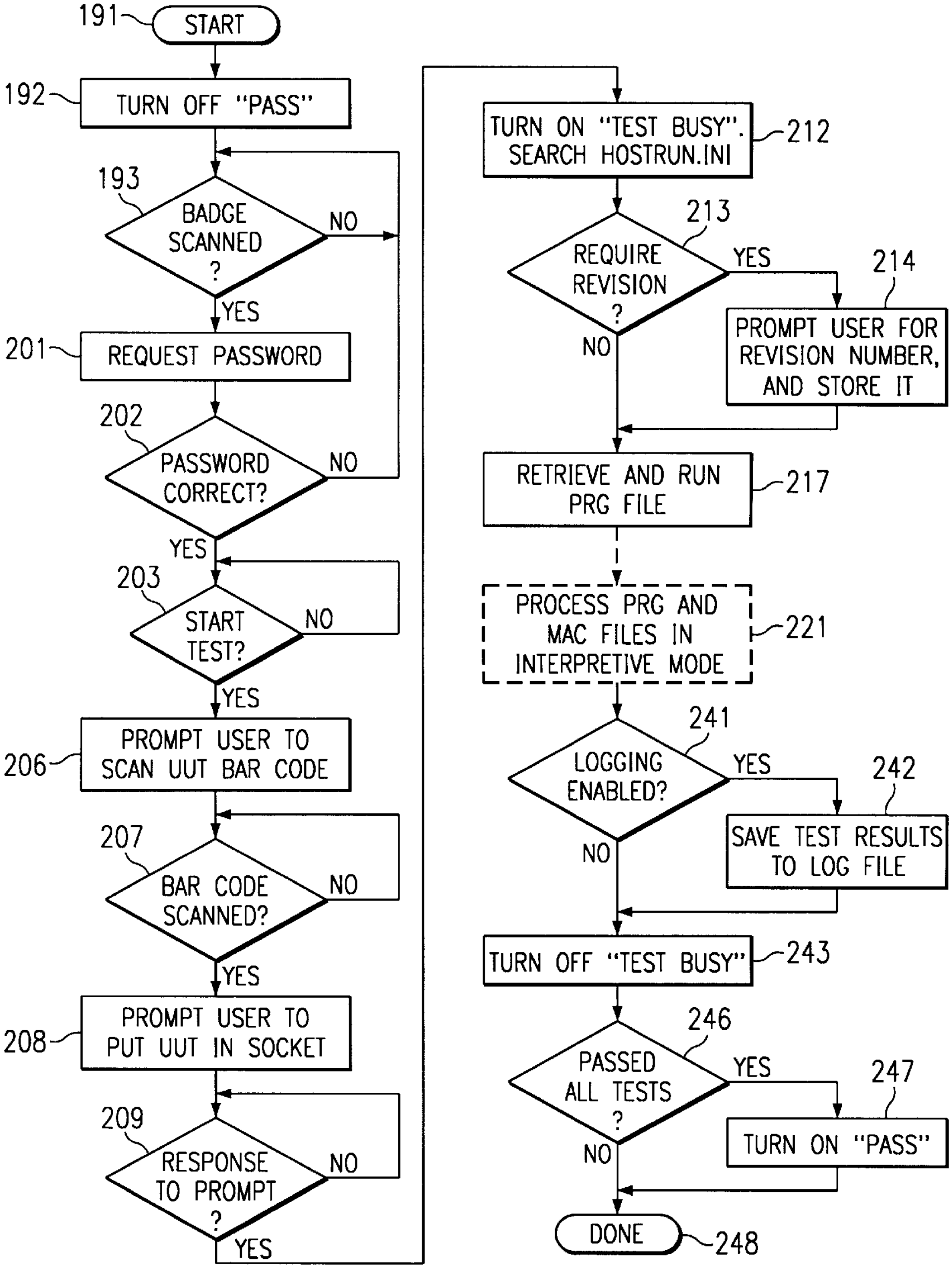
FIG. 4 is a flowchart showing a sequence of operations carried out by the test system of FIG. 1.

FIG. 4 is a flowchart showing the general sequence of operations in the portion of the HostSoft.EXE program which carries out testing of a given unit under test. With respect to this portion of the program, execution begins at block 191, at which point the HostSoft.EXE program is presenting on the display 42 (FIG. 1) the main screen 146 shown in FIG. 3. Control proceeds from block 191 to block 192, where the system makes sure that the PASS indicator 154 (FIG. 3) is off, for example by setting the letters "PASS" to a subdued color such as black. Then, at block 193, the system waits for an operator to use the bar code reader 47 to scan the bar code label 122 on the badge 121 of that particular operator. The bar code label provides the name of the operator, or an operator number from which the name of the operator can be determined. The bar code label 122 may optionally provide information regarding the privilege level of that particular operator, although the privilege level may alternatively be obtained by using the operator name or number to access a table of privilege information stored on the hard disk drive 52.

Figure 5:
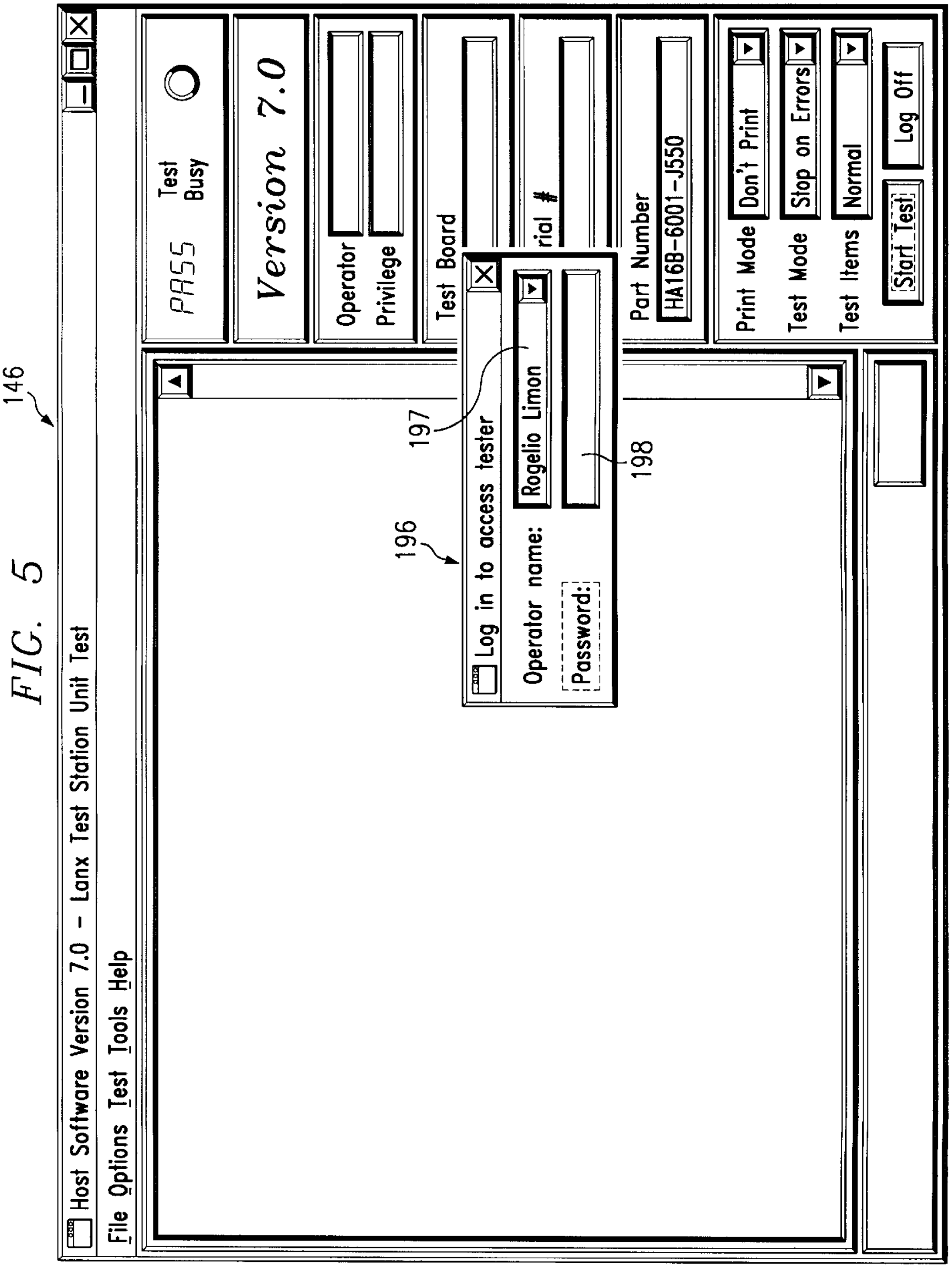
FIG. 5 is a diagrammatic view of a display screen similar to the screen of FIG. 3, but showing an operator log-in operation.

With reference to FIG. 5, the system superimposes on the main screen 146 a log-in window 196, and displays the name of the operator, as determined from the badge, in a region 197 of the window 196. The window 196 also includes a region 198 for the operator to enter a password. The display of the window 196 in FIG. 5 corresponds to block 201 in FIG. 4, where the system requests a password from the operator. At block 202 in FIG. 4, the system waits for the operator to enter the password in the region 198 of window 196, and then checks to make sure that the entered password is the correct password for the particular operator. The system uses the operator name or number to access a table stored on the hard disk drive 52, in order to obtain the current password for that particular operator. If the password entered by the operator does not match the password from the table, the operator may be allowed to try entering the password a second time. However, if the operator is not able to enter the correct password after a reasonable number of attempts, control is returned to block 193, to wait for a different operator to scan the bar code label on his or her operator badge.

Figure 7:
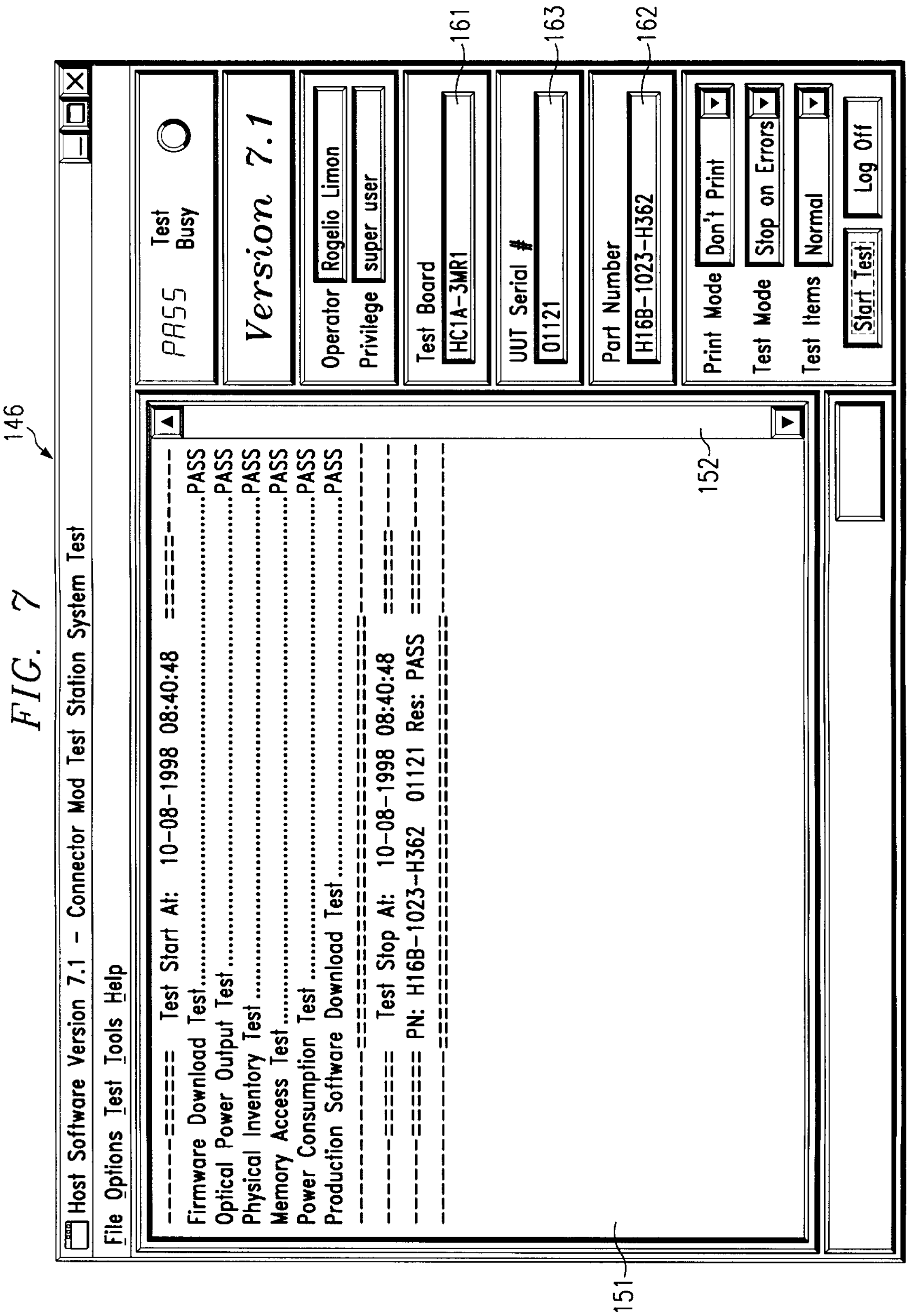
FIG. 7 is a diagrammatic view of a display screen similar to FIG. 3, but also displaying information which documents the results of tests conducted by the test system.

Once the correct password has been entered, control proceeds from block 202 to block 203, where the system waits for the operator to authorize the system to begin a test, either by actuating the Start Test button 172 or by selecting the Start Test option from the Test Menu 178. Once the operator starts a test, control proceeds from block 203 to block 206, where the system prompts the operator to use the bar code reader 47 to scan the bar code label 117 on the UUT 13 which is to be tested. The system waits for the bar code label to be scanned at block 207. The information obtained from the bar code label 117 may include the board name, the board part number, and a serial number, which the system will then display in the regions 161–163 (FIG. 3) of the main screen 146, for example as visible at 161–163 in FIG. 7.

After the operator scans the bar code label, the system proceeds to block 208, where it prompts the operator to couple the connector 37 on the UUT 13 to the tester connector 36 of the test station 23, and then waits for the operator to do so at block 209. The operator does not yet connect to the UUT 13 any of the other cables 77, 79, and 96–97, as there will be separate prompts later for any or all of these cables. When the operator has coupled the connectors 36 and 37 together, the operator responds to the prompt by pressing the ENTER key on the keyboard 43, or by some other similar action, which causes the system to proceed from block 209 to block 212.

At block 212, the system turns on the Test Busy indicator 153, in particular by changing this portion of the screen from a subdued color such as gray to a more pronounced color such as red. Then, a search is made of the HostRun.INI file which, as discussed in association with FIGS. 1 and 2, is stored in the HostSoft subdirectory 133 of the hard disk drive 52. An excerpt from this file is shown in Table 13. It includes a "[BOARDS]" section, which lists the part number of each known board, followed by an equal sign and a unique code. In the case of the specific UUT 13 which is the subject of this example, and as shown in Table 13, the part number is "H16B-1023-H362", and the corresponding unique code is "3MR1". The HostRun.INI file also includes a number of additional sections, each of which corresponds to a respective one of the unique codes. As shown in Table 13, there is a section "[3MR1]", which corresponds to the particular UUT 13. Each such section contains certain standard items of information, including the name of the board, the name of the PRG file which is provided to test the board, the names of the subdirectories which include the PRG and MAC files used to test the board, and an indication of whether the system should have the operator verify the revision number of the board. It will be noted that the specific PRG file identified in Table 13 for the UUT 13 of FIG. 1 is "3MR1.PRG", which is the specific PRG file set forth in Table 2.

In FIG. 4, control then proceeds from block 212 to block 213, where the system checks to see whether the "RequireRevision" parameter in the HostRun.INI was "Yes". If so, control proceeds to block 214, where the system prompts the operator to enter a revision number which is visible on the UUT 13, and the system then stores this revision number for later use. Control ultimately continues at block 217, where the system uses the "ProgramDir" parameter of the HostRun.INI file to identify the subdirectory containing the specified PRG file, which in this case is the Programs subdirectory 136 of FIG. 2. The system then retrieves from this subdirectory the PRG file which is specified by the "ProgramFile" parameter of the HostRun.INI file, which in this case is the "3MR1.PRG" file shown in Table 2.

Control then proceeds to block 221, where the HostSoft.EXE program being executed by the processor 51 processes the 3MR1.PRG file shown in Table 1 in an interpretative manner, as already discussed above. As this is carried out, this PRG file will directly and indirectly invoke ten macro files, which are the MAC files shown in Tables 3–12. Based on the "MacroDir" parameter in the HostRun.INI file (Table 13), the system knows that these MAC files are all located in the Macros subdirectory 137 of FIG. 2. As discussed above, these MAC files will also be processed in an interpretative mode.

As explained above, the PRG and MAC files shown in Tables 2–12 are provided primarily by way of example, and are self-explanatory when considered in conjunction with the command set forth in Table 1. Thus, a detailed discussion of every step which occurs during interpretation of these specific PRG and MAC files is not necessary. However, a brief overview will be provided as a convenience, and certain selected steps will be discussed in more detail.

More specifically, the following is an overview of what happens in block 221 during processing of the specific exemplary PRG and MAC files which are set forth in Tables 2–12. It is important to recognize that these correspond directly to testing of one particular type of unit to be tested, which is the optical telecommunications board 13 shown in FIG. 1. Substantially different PRG and MAC files might be used to test other units. The 3MR1.PRG file of Table 2 is primarily a sequence of calls to various MAC files.

More specifically, and with reference to Table 2, the 3MR1.PRG file begins by calling the InitializeEquipment.MAC macro, which is shown in Table 3. This macro then calls the Power.MAC macro shown in Table 4, which turns on and configures the power supply 83 (FIG. 1) for the UUT 13. Then, the InitializeEquipment.MAC macro of Table 3 interprets several commands that initialize the optical power meter instrument 86, followed by commands that initialize the optical attenuator 93 and the serial port 61.

Control then returns to the 3MR1. PRG file of Table 2, which calls the FirmwareDownloadTest.MAC macro shown in Table 5. In general, this macro effects programming of the lattice device 113 on the UUT 13, by downloading into it a file of binary information. In this regard, the second command in the macro includes a reference to an identifier "IC34", which may be an integrated circuit number of the part to be programmed, and which will be used as a search parameter within the database file located in the Tables subdirectory 139 (FIG. 2). In this regard, the database file in the subdirectory 139 includes a programmable device database, an excerpt from which is shown in Table 14.

With reference to Table 14, each record in the database includes six fields, the first of which is a board part number such as "H16B-1023-H362", a board revision number such as "002A", an identifier such as "IC34", the name of a configuration file such as "OptBd.LAT", a first checksum value such "05FE" and a second checksum value such as "F97D". At this point in time, for the particular UUT 13 which is to be tested, the system has already obtained the board part number (for example at blocks 206–207 in FIG. 4), has already obtained the board revision number if there is one (for example at blocks 213–214 in FIG. 4), and has obtained an identifier (for example "IC34" from the macro in Table 5). The system then searches the database of Table 14 in an attempt to find a record with a matching part number, revision number and identifier. If the test station 23 does not find a matching record in the database of Table 14, which is stored on the local hard disk drive 52 of FIG. 1, then the test station 23 will interact with the server 16 in order to search the database file stored on the hard disk drive 28 of the server 16. The database file in the server 16 may be more up to date, and may thus include a record that matches the search parameters. In the instant example, it is assumed that a match is found in the database of Table 14, so that the system obtains the lattice configuration filename "OptBd.LAT", and the two associated checksums.

The system will then retrieve the OptBd.LAT configuration file from the HostSoft subdirectory 133 (FIG. 2), exemplary contents of which are shown in Table 15. The information in this lattice configuration file includes the term "PrgDevs\7503H999.jed", which is an identification of a binary file named "7503H999.jed". This binary file is located in the PrgDevs subdirectory 138 (FIG. 2). The system retrieves this binary file, and supplies it through the connectors 36 and 37 (FIG. 1) to the processor 111 on the UUT 13, which in turn programs the contents of this binary file into the lattice device 113. It will be noted that, in this manner, the test station 23 ensures that the lattice device 113 on the UUT 13 is correctly programmed with the most up-to-date version of the firmware associated with the particular part number and revision number for the UUT 13. This is all handled automatically, without operator involvement, thereby substantially avoiding the possibility of error.

Then, the processor 111 on the UUT 13 uses the checksum information from the database (Table 14) to verify that the download of information into the lattice device 113 has been accurately and successfully completed. The macro of Table 5 receives a return value from the command which effected the firmware download, and the macro checks the return value in order to determine whether the download was successful. Control then returns to the PRG file of Table 2, which calls the OpticalPowerTest.MAC macro of Table 6. This macro in turn calls the MeasureOpticalPower.MAC macro of Table 7, which interacts with the optical power meter instrument 86 (FIG. 1) so as to carry out an optical power measurement. The results are then evaluated, and control ultimately returns to the PRG file of Table 2.

Figure 6:
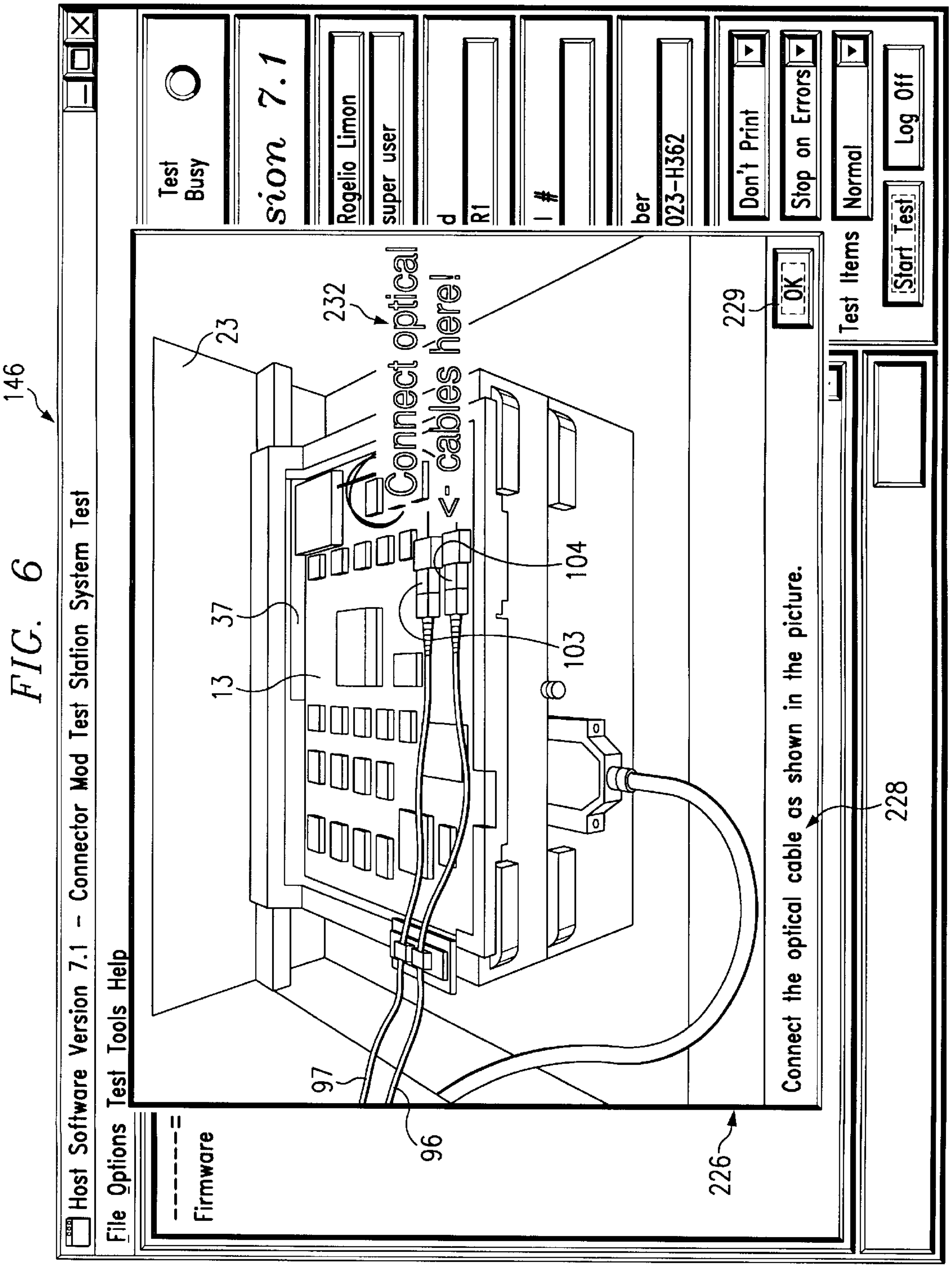
FIG. 6 is a diagrammatic view of a display screen which includes a window presenting both a graphic image and related alphanumeric information to an operator of the test system.

Then, the 3MR1.PRG file of Table 2 carries out a command which displays a message telling the operator to "Connect the optical cables as shown in the picture", while simultaneously displaying a picture showing how to do this. The displayed picture is obtained from the bit-map graphics file "Optical.BMP", which is one of the BMP files located in the HostSoft subdirectory 133 (FIG. 2). In more detail, and as shown in FIG. 6, the system superimposes a special window 226 over part of the main screen 146, the upper portion of the window 226 being a direct display of the Optical.BMP file, and the lower portion of the window containing the specified message at 228, along with an "OK" button 229. In the disclosed embodiment, the BMP information displayed in the upper portion of the window 226 is a digitized photograph, but it could alternatively be a comparable diagram.

In FIG. 6, the BMP image displayed in the upper portion of the window 226 is an accurate view of the test station 23 and the UUT 13 as they actually appear to the operator. This image shows the operator where the optical connectors 103 and 104 are physically located on the UUT 13, and shows how the optical cables 96 and 97 should properly be routed to and coupled to these connectors 103 and 104. The image itself includes a legend 232, which says "Connect optical cables here", and includes an arrowhead pointing to the optical connectors. This image helps an inexperienced operator to remember to connect the optical cables, to do so at the proper point in the test sequence, and to easily and correctly connect the cables, all without extensive training. Given that the test station 23 is capable of testing a number of different types of units, a new operator can accurately and reliably conduct tests on a wide range of units, without undergoing an extensive training process.

While the particular BMP image, message 228 and legend 232 in FIG. 6 all have to do with the connection of optical cables, it will be recognized that a sequence of equivalent windows containing other images and messages could be used to lead an operator through the manual steps needed in order to effect testing of a particular type of unit. It will also be recognized that a window similar to window 226 could be used to request an operator to provide input information. For example, if a particular type of circuit board has a light emitting diode (LED), the system could display a BMP image showing the board and the location of the LED thereon, with a request that the operator actuate one of two displayed buttons in dependence on whether the LED is currently on or off.

It was mentioned above that the Options Menu 177 (FIG. 3) has a "View Pictures" option. This option permits an operator to selectively permit or suppress the display of the BMP image in each window of the type shown at 226 in FIG. 6. That is, if the operator enables the "View Pictures" option, the BMP image will be displayed in each such window, in a manner similar to window 226 of FIG. 6. On the other hand, if the operator has disabled the "View Pictures" option, the BMP image would not be displayed, and thus the window 226 of FIG. 6 would present only the message 228 and the button 229, without any BMP image.

When the operator has properly connected the optical cables, and has thus complied with the request presented by the window 226, the operator actuates the "OK" button 229, in order to indicate to the system that the requested manual task has been completed. The system then removes the window 226 from the screen. Thereafter, the PRG file carries out a call to the macro PhysicalInventoryCheck.MAC, which is shown in Table 8. This macro begins by retrieving from the HostSoft subdirectory 133 (FIG. 2) a library file "PhyInv.LIB", which is a compiled file. The system loads and in due course executes this library file, which requests information from the HostSoft program regarding what board is being tested, then writes physical inventory information through the processor 111 to the EEPROM 114 of the UUT 13, then verifies that the information was stored correctly, and then returns a result back to the HostSoft program.

Control returns to the PRG file of Table 2, which then calls a MemoryTest.MAC macro. The MemoryTest.MAC macro is shown in Table 9, and performs a memory test. This macro includes loading and execution of a compiled library file "MemTest.LIB", which requests information from the HostSoft program to determine what board is being tested, then writes pattern information to all locations of testable memory on the UUT 13, then reads all such testable memory locations and to verify that the contents are correct, and then returns a result back to the HostSoft program.

Next, the PRG file of Table 2 calls a PowerConsumptionTest.MAC macro, which is shown in Table 10. This macro interacts with the power supply 83 in order to determine the current level of power consumption of the UUT 13, and then evaluates this current level of power consumption.

Thereafter, the PRG file of Table 2 calls a production software download macro ProdSoftwareDownload.MAC, which is shown iii Table 11. This macro effects programming of the flash memory 112 on the UUT 13, using a file transfer protocol (FTP) download. This is carried out in a manner which, in general, is similar to the above-described sequence by which the lattice device 113 is programmed. In brief, the system takes the board part number, the board revision number (if any), and the identifier "IC3, IC4" obtained from the macro of Table 11, and searches the database of Table 14. If necessary, the database in the server 16 is also searched. When a match is found, the system obtains the name of an FTP configuration file such as "OptBd.FTP", and two checksum values.

The system retrieves the FTP configuration file OptBd.FTP from the HostSoft subdirectory 133, the exemplary contents of which are shown in Table 16. The information in this FTP configuration file includes parameters which will control the FTP transfer, as well as a path identifying a binary file which is to be downloaded into the flash memory 112. The system then transfers the binary file to the processor 111, which programs it into the flash memory 112. From the point of view of the calling macro file, the primary difference between the commands which respectively program the lattice device 113 and the flash memory 112 is that the former automatically evaluates the checksums, whereas the latter does not. Thus, if checksum evaluation is desired in the case of the FTP transfer, it must be done by providing additional commands within the macro.

After completion of the ProdSoftwareDownload.MAC macro shown in Table 11, the PRG file of Table 2 calls the ShutDown.MAC macro of Table 12, which simply calls the Power.MAC macro of Table 4 in order to turn off the power supply 83. Then, the PRG file of Table 2 concludes by providing a window similar to that shown at 226 in FIG. 6, except that the BMP image and the message instruct the operator to disconnect the optical cables 96 and 97 from the UUT 13.

As the test station 23 is processing the PRG and MAC files of Tables 2–12, these files output successive messages to the workspace 151 of the main screen 146 (FIG. 3), to indicate whether each test operation conducted on the UUT 13 has passed or failed. Assuming that all the test operations conducted by the PRG and MAC files of Tables 2–12 are successful, then when processing of all these files reaches completion, the information displayed in the workspace 151 will be that shown in FIG. 7. In particular, this information identifies successive tests which were conducted, and the fact that the UUT 13 passed each such test. If the UUT 13 had failed any test, the information displayed in workspace 151 would indicate this.

Referring again to the flowchart of FIG. 4, when the system has completed interpretative processing of the PRG and MAC files of Tables 2–12, control proceeds from block 221 to block 241, where the system checks to see whether logging is enabled. As discussed above, the operator can selectively toggle logging on and off, using either the button 173 (FIG. 3), or the "Log Test Results" option of the Options Menu 177. If logging is enabled, then control proceeds from block 241 to block 242, where the test station 23 stores certain test results in a log file which is located in the LogFiles subdirectory 140 (FIG. 2) of the local hard disk drive 52 (FIG. 1).

In the disclosed embodiment, the information which is logged includes at least the board number, part number, serial number, operator name, and an indication of whether or not the board passed each of the tests which were conducted on it. This system could optionally log more information or less information. The server 16 of FIG. 1 is programmed to periodically use the network 17 to interrogate the log files located in the LogFiles subdirectory 140, and to transfer.information from these files to a log file located on the hard disk drive 28 of the server 16.

From blocks 241 and 242, control ultimately proceeds to block 243, where the system turns off the Test Busy indicator 153, in particular by changing this portion of the screen from a noticeable color such as red to a subdued color such as gray. Then, at block 246, the system checks to see if the UUT 13 passed all of the tests which were conducted on it. If so, control proceeds to block 247, where the system turns on the PASS indicator 154, for example by changing the letters "PASS" from a subdued color such as black to a noticeable color such as green. In either case, control ultimately proceeds to block 248, which represents completion of the testing of the UUT 13.

As mentioned earlier, the system has a special debug mode, which can be toggled on and off by selecting the Debug Mode option from the Options Menu 177 (FIG. 3). When debug mode is not enabled, then the system will test the UUT 13 by carrying out the entire test definition set forth in the PRG and MAC files without stopping, except in certain limited circumstances. In particular, it will temporarily stop when a PRG or MAC file requests an action by or some input from the operator, for example a request that the operator effect connection of the optical cables as discussed above in association with FIG. 6, or a request that the operator read and input the current state of an LED on the unit under test. In addition, if the operator has used the Test Mode drop-down list 168 to select the "Stop On Errors" mode of operation, the system will stop if it detects any error during the test.

In contrast, when the debug mode is enabled, it provides some special capabilities which permit greater operator interaction while a test is being carried out. This can be used to develop and/or debug a PRG or MAC file, or to make temporary modifications to a PRG or MAC file for the purpose of isolating an elusive problem in a particular unit being tested. As soon as the debug mode is turned on, a special prompt will appear in the workspace 151 of the main screen 146 (FIG. 3). This debug prompt is "Debug>". Following the debug prompt, the operator can type any proper command from the command set of Table 1, and that command will immediately be interpreted when the operator ends the command by pressing the ENTER key on the keyboard 43. Alternatively, the operator can type the name of a macro file after the debug prompt, and that macro file will be immediately interpreted. Similarly, the operator can type the name of a PRG file, and the PRG file, along with any associated MAC files, will be immediately interpreted. During the debug mode, the operator can also use the "Select Macro To Run" option from the Test Menu to specify a macro, which will be immediately interpreted. The "Select Macro To Run" option works only when the debug mode is enabled.

In the debug mode, the operator can alter a PRG or MAC file. In particular, at the debug prompt, the operator may type "MACRO name", where the name of macro of interest is "name.MAC" or "name.PRG". This causes HostSoft.EXE to open a special window with editing capabilities, in which is displayed an ASCII text listing of the specified MAC or PRG file. In the disclosed embodiment, the HostSoft.EXE program does this by invoking a special window which is an inherent feature of the resident operating system, and which permits a file to be opened, edited, saved, and closed. Since this special window is an inherent feature of the resident operating system, it is not illustrated and described here in detail. However, it will be recognized that the HostSoft.EXE program could be written to provide such a window on its own, rather than by invoking a window feature of the resident operating system.

When the operator is done modifying the selected PRG or MAC file, the operator saves the modified file and then closes the special window. When the modified macro is saved, the modified version thereof is located only on the local hard disk drive 52, and not in the master definition of that macro in the archive file on the hard disk drive 28 of the server 16. If the operator ultimately wants to replace the master definition of the macro with the modified version from the local disk drive, the operator must effect a standard file transfer operation in order to copy the modified macro file from the local hard disk drive 52 to the server hard disk drive 28.

Figure 8:
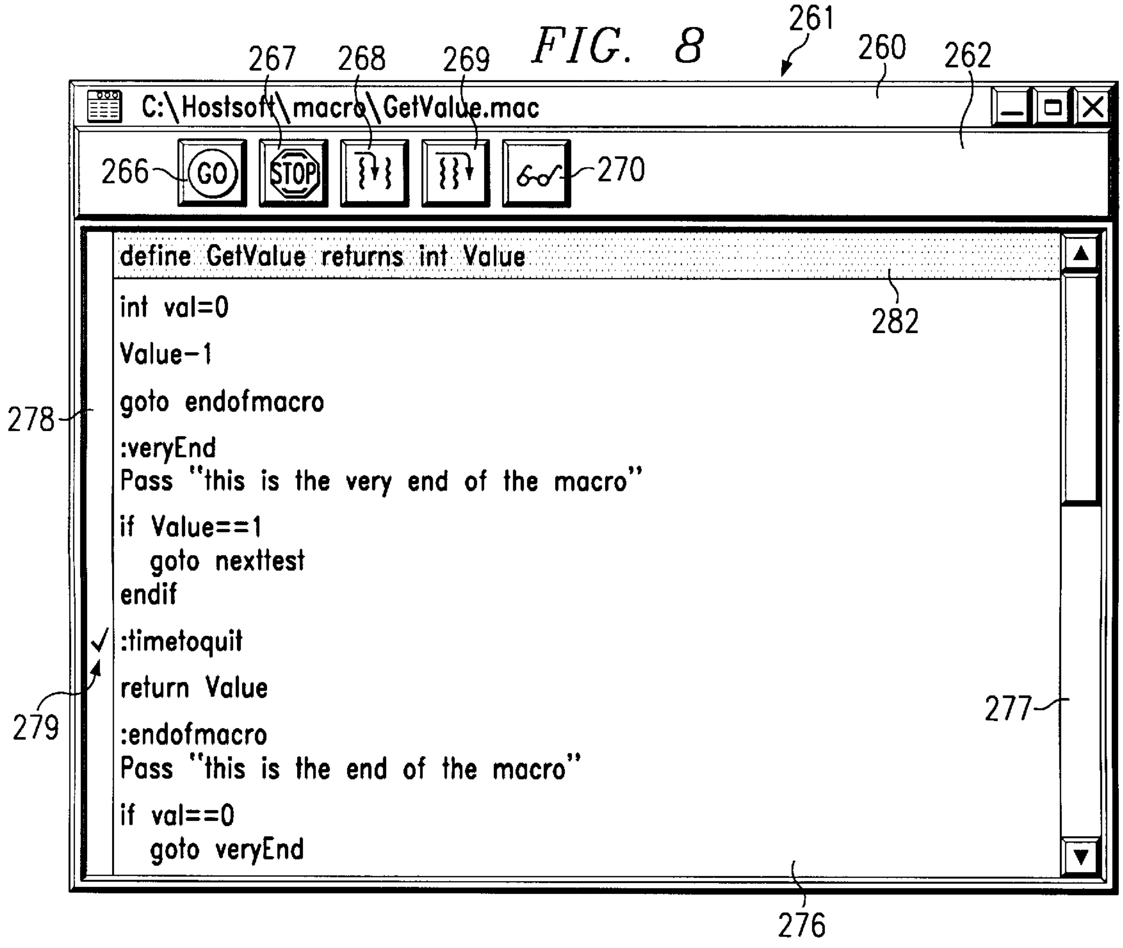
FIG. 8 is a diagrammatic view of a special display screen used for certain special modes of operation of the test system of FIG. 1.

When the debug mode is enabled, the operator also has the capability to set one or more breakpoints, or in other words to identify any command in a PRG file or MAC file as a breakpoint. When the system is processing a PRG or MAC file and reaches a command which has been designated as a breakpoint, the system stops and waits for operator authorization to proceed with processing of the breakpoint command. In the disclosed embodiment, the operator sets or clears a breakpoint in the following manner. The operator selects the "Open Macro" option from the File Menu 176 (FIG. 3), which then presents to the operator a illustrated window containing a list of macro files located in the Macros subdirectory 137 (FIG. 2). The operator selects from this list the macro of interest, and the system then opens a special Open Macro window 261, which is shown in FIG. 8 in a manner superimposed over the entirety of the main screen 146. Across the top of the Open Macro window 261 is an industry standard title bar 260, and under the title bar 260 is a button bar 262. The button bar 262 has a GO button 266, a STOP button 267, a STEP THROUGH button 268, a STEP OVER button 269, and an INSPECT VARIABLES button 270. The buttons 266–270 are each discussed in more detail later.

Below the button bar 262, the Open Macro window 261 has a workspace 276, along the right side of which is a vertical scroll bar 277. Along the left side of the workspace 276 is a breakpoint column 278. The ASCII text from the selected macro file is displayed in the workspace 276. In order to specify that a particular command is to be a breakpoint, the operator selects the line which contains that command, for example by clicking on that line through use of the mouse 46 (FIG. 1). The system responds by displaying a check mark (✓) in the breakpoint column 278 and immediately to the left of the selected line, for example as shown at 279. If the operator clicks on that same command line again, the command will be deselected as a breakpoint, and the check mark 279 will be removed.

After setting or clearing a breakpoint, the operator can close the window 261 or leave it open. If the window 261 is left open, then when that particular macro is being processed in an interpretative mode by the system, a highlighted region such as that shown at 282 will be moved from command to command in order to identify the command which is currently being interpreted. While the macro is being interpreted, the operator can halt the interpretation at any point by actuating the STOP button 267. To thereafter continue execution, the operator can actuate the GO button 266. If the system automatically stops at a particular command because that command has been specified as a breakpoint, then the operator can thereafter cause the interpretation to continue by actuating the GO button 266.

As previously mentioned, the Options Menu 177 (FIG. 3) also includes a "Step Modie" option, which is used to toggle a step mode capability on and off. The step mode is a further feature of the debug mode. When step mode is enabled, and when the system is interpreting a given macro file, the system will stop before interpreting each command, and will wait for authorization to proceed to interpret the command. Thus, the operator can step through the command sequence in that given file, one command at a time. More specifically, the operator does this by actuating either the STEP THROUGH button 268 or the STEP OVER 269. If the command in question is any one of the commands from the command set shown in Table 1, then the buttons 268 and 269 will both have the same effect. In particular, the system will proceed to interpret that command, and then will stop before interpreting the next command.

On the other hand, if the current command is a call to a macro file, the buttons 268 and 269 produce different results. In particular, if the operator actuates the STEP OVER button 269, the system will interpret all applicable commands in the called macro and in any macros which it calls, and will not stop in any such called macro except for a reason which would cause a stop if the step mode was disabled. When all pertinent commands in the called macros have been processed the system will then stop before executing the next command in the calling macro. In contrast, if the operator actuates the STEP THROUGH button 268, the system will open an additional similar window for the macro being called, and single step through each of the commands in that called macro. When the system is in step mode and completes interpretation of the last command in a given macro file, the system will automatically close the window for that macro if the window was automatically opened by the system, but will leave the window open if the window was manually opened by the operator.

A further feature of the debug mode involves the capability to change the values of variables, which include not only internal variables used by PRG and MAC files, but also variables containing data which has been received back from the UUT 13 during the testing process. There are two techniques which the operator can use to inspect and/or change a variable. The first technique is to switch to the main window 146 of FIG. 3, and to type at the debug prompt a proper command which is from TABLE 1, and which has the effect of changing the value of the variable of interest.

Figure 9:
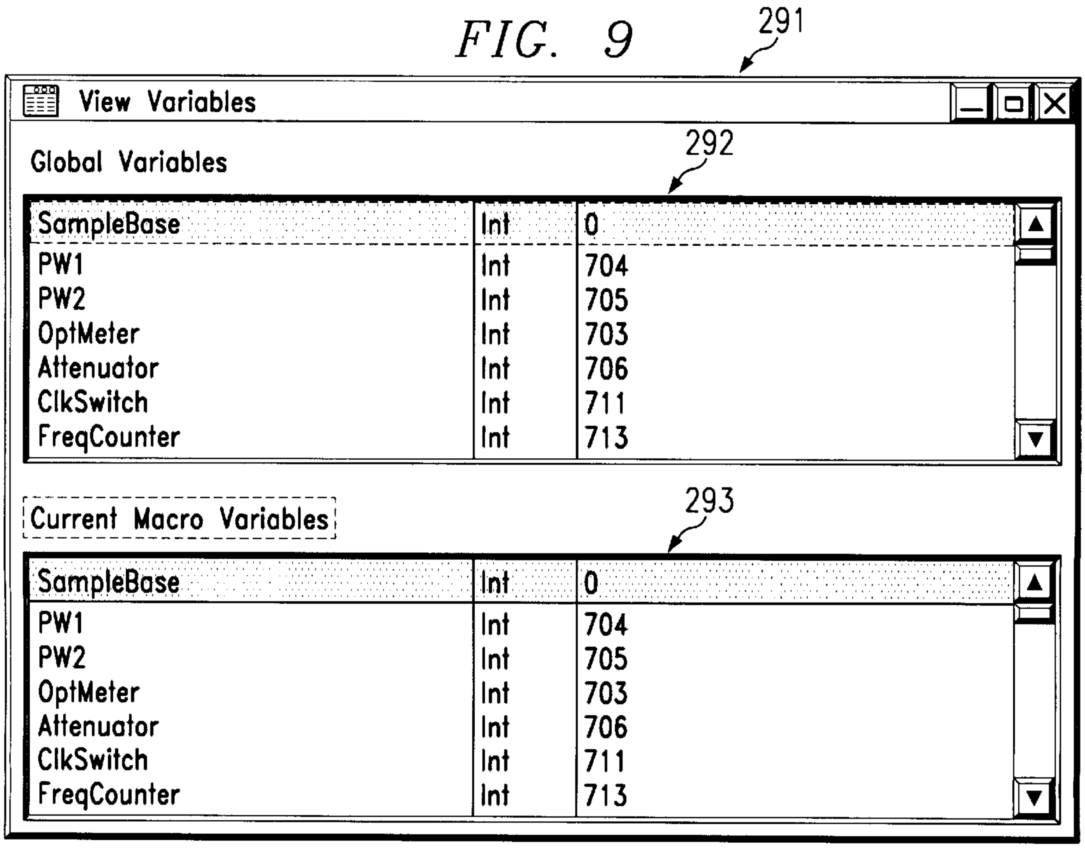
FIG. 9 is a diagrammatic view of a special window which can be presented on the display screen by the test system of FIG. 1, in order to permit an operator to observe a plurality of different variables and their values.
Figure 10:
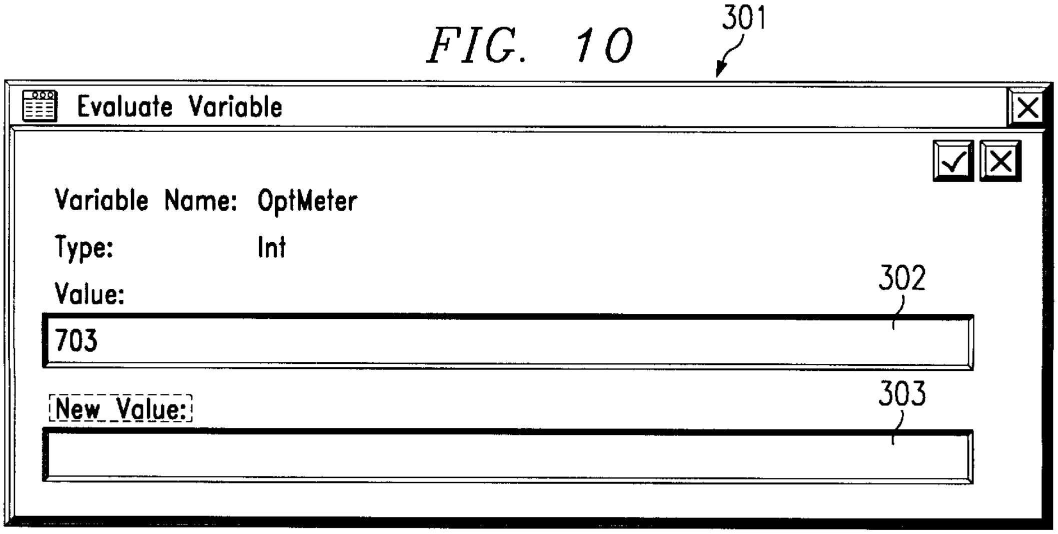
FIG. 10 is a diagrammatic view of a further window which can be presented on a display screen by the test system of FIG. 1, in order to display information regarding a particular variable, and to permit dynamic alteration of the contents of that variable.

The second technique is to actuate the INSPECT VARIABLES button 270 in the Open Macros window 261 of FIG. 8, which causes the system to open a special View Variables window, an example of which is shown at 291 in FIG. 9. This window 291 includes a list 292 of all global variables, and a further list 293 of all local variables maintained by the current macro. Each list includes the name of the variable, the variable type (for example, "Int" for an integer variable), and the current value of the variable. If the operator wishes to change the value of a particular variable, then the operator can select that variable from the appropriate one of the lists 292 and 293, for example by using the mouse 46 to click on that name of that variable. In response, the system will open an Evaluate Variable window 301, an example of which is shown in FIG. 10. The window 301 is specific to a single variable, and displays for that variable the same information which was shown in the View Variables window 291 of FIG. 9, including the variable name, the variable type, and the current value 302 of the variable. However, the window 301 also includes a region 303, where the operator can enter a new value for that variable, which then replaces the current value.

Figure 11:
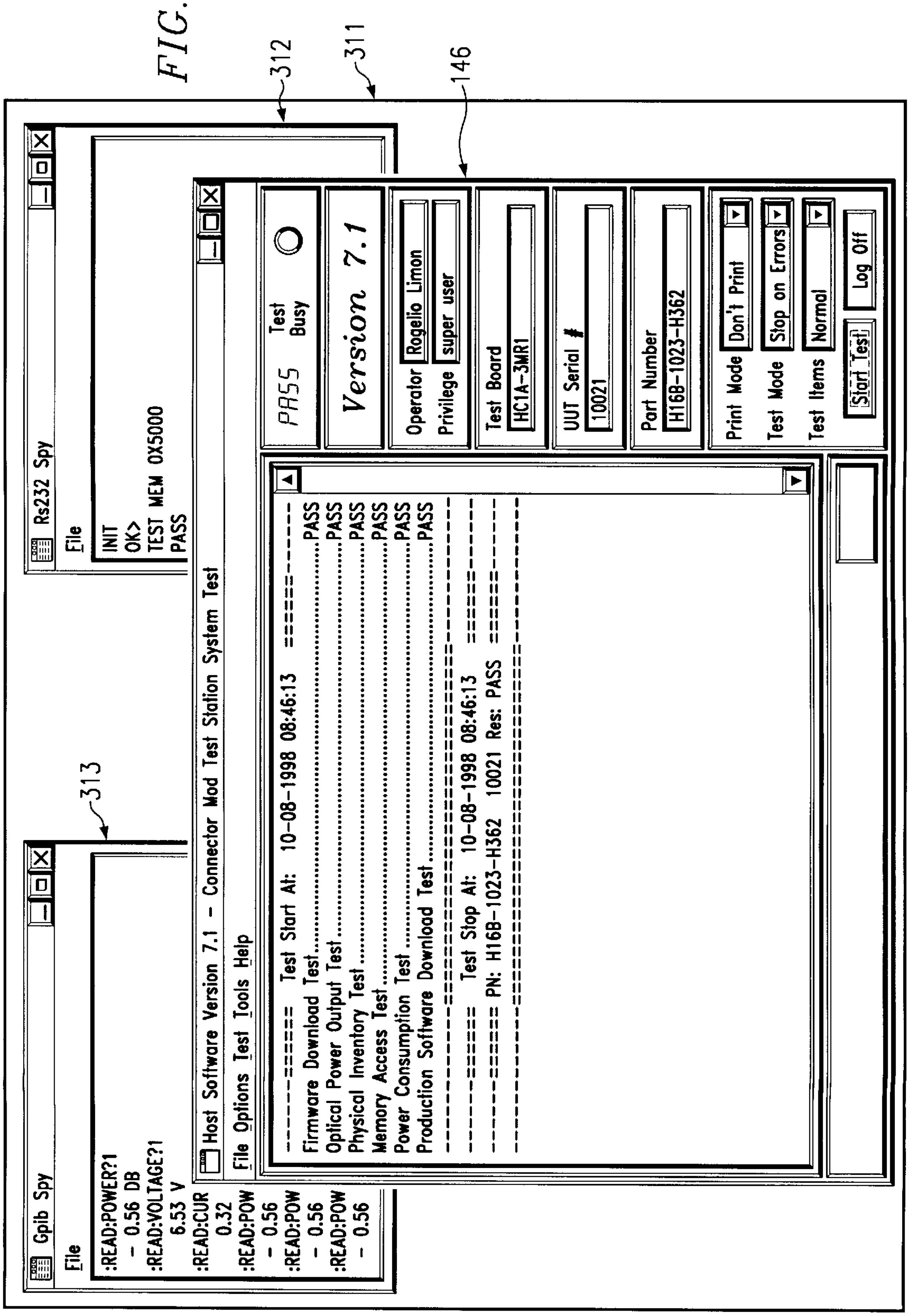
FIG. 11 is a diagrammatic view of a display screen which has several windows, including a window for the operating system, a window similar to FIG. 7, and two additional windows which each display information passing to and from a test unit through respective ports of the test system of FIG. 1.

As previously discussed, the Tools Menu 181 (FIG. 3) includes "RS232 Spy" and "GPIB Spy" options. Selecting either option toggles on or off the associated feature, each of which involves a special window. More specifically, FIG. 11 shows a window 311 corresponding to the operating system, show the window 146 in a partially minimized size, and shows two additional window 312 and 313. The window 312 is the RS232 Spy window, which provides a scrolling visual display of input and output data passing through the serial port 61 (FIG. 1), for example in a hexidemical format. Similarly, the window 313 is the GPIB Spy window, which provides a scrolling visual display of input and output data passing through the GPIB interface 81. The windows 312 and 313 each appear when the Tools Menu is used to toggle the associated feature ON, and each disappear when the Tools Menu is used to toggle the associated feature OFF.

Logging of data to a log file in the LogFiles subdirectory 140 (FIG. 2) is not permitted when the system is operating in the debug mode. Accordingly, if logging is enabled when the operator turns on the debug mode, the system will automatically suppress logging so long as the debug mode is enabled, and will then automatically resume logging as soon as the debug mode is disabled.

As discussed above, the drop-down list 167 for the Print Mode determines whether information will be printed at all and, if so, whether all appropriate information will be printed or only that information associated with errors. In this regard, information which is considered appropriate to print includes all information which is sent to a log file if logging is enabled, and the information which is shown in workspace 151 of FIG. 7.

In the foregoing discussion of how the PRG and MAC files of Tables 2–12 are interpreted, it was explained that it is possible for these uncompiled files to load and initiate execution of a compiled file, such as the library routines PhyInv.LIB and MemTest.LIB. In a similar manner, it is possible for these uncompiled files to load and run a compiled Dynamic Link Library (DLL) file, which is one of the types of files stored in the HostSoft subdirectory 133. When this occurs, it is possible for the DLL file to continue to run after it returns control to the calling PRG or MAC file, such that some subsequent commands in the PRG or MAC file are interpreted in parallel with execution of the DLL file. Thus, two or more routines or "threads" can be running at the same time. These threads can pass information back and forth between each other through variables. This allows simultaneous testing of different parts of a unit under test.

As mentioned above, the Test Items drop-down list 169 (FIG. 3) can be used to select either a Normal mode of operation or a Sample Base mode of operation. Table 17 shows an excerpt from a macro file, which includes two groups of macro commands that are respectively designated in Table 17 as Group A and Group B. The commands of Group B are located between an "if" command and an "endif" command, the "if" command being conditional on whether the Sample Base mode is enabled. The commands of Group A will always be always be interpreted, regardless of whether the system is operating in the Normal mode or the Sample Base mode. In contrast, the commands of Group B will be interpreted only if the Sample Base mode is enabled, and will be ignored if the system is operating in the Normal mode. Thus, in this example, more testing will be carried out in the Sample Base mode than in the Normal mode.

The present invention provides a number of technical advantages. One such technical advantage is that substantially all of the test definitions are set forth in the form of uncompiled files, which are processed in an interpretative mode, and which include commands that are easily readable and intuitive, with a high level syntax. This reduces the time and effort required to develop and troubleshoot test definitions, provides greater portability of a given test definition between different test systems, and reduces the learning curve and amount of time involved in training a new operator or test developer. Due to the portability, it also permits a test developer or test operator to more easily move between different test systems, without extensive cross-training unique to each of the test systems. As to a given test system, it reduces or eliminates the use of different languages by different test developers.

A further technical advantage involves the provision of the debug mode in a test system, in order to simplify the debugging of new test definitions, and in order to permit quick and easy modification of existing test definitions, for example for the purpose of troubleshooting a particular elusive problem in a specific unit under test. Among other things, the debug mode includes the capabilities to selectively run portions of an overall test, to easily set and remove breakpoints within a test definition, to single step through the commands in a test definition, to inspect or change variables involved in testing, and/or to monitor input and output data traveling through certain ports of the test station. A related technical advantage is the capability to dynamically modify an existing test definition during processing of that test definition, either temporarily or permanently.

Another technical advantage results from the fact that the uncompiled commands have the capability to initiate execution of a compiled file, so that a particular test operation which is unusually complex or which involves special real-time considerations can be realized. Another technical advantage involves the capability to provide step-by-step instructions to an operator regarding each manual act which the operator needs to do in order to carry out a given test definition. This may include the capability to display a photograph or diagram depicting exactly what the operator should do. This permits an operator to accurately and reliably conduct tests on a variety of different products with only a limited amount of training.

Yet another technical advantage results from the use of machine-readable indicia on parts which are to be tested, for example in the form of a bar code, in order to accurately identify the particular part. This ensures that any programmable devices on the part can be loaded with the correct version of information necessary to program them, so that the parts will be correctly programmed when they are later sent into the field. Further, it ensures that the correct test definition will be used for testing each part, especially where different revisions of the same part may require different test definitions. Moreover, this selection of information to download into programmable parts, and selection of the correct test definition, is effected automatically, thereby substantially eliminating the possibility of an operator error.

Although one embodiment has been illustrated and described in detail, it should be understood that various substitutions and alternations can be made therein without departing from the spirit and scope of the present invention, as defined by the following claims.

TABLE 1

MACRO COMMANDS

; <comment>
Comment line. All characters following the semicolon are ignored. Parameters:
<comment> — ASCII comment (Optional)

: <label>
The colon designates a label, which marks a possible destination point for a Goto command. Parameters:
<label> — Text word.

.MACn
Variable for Ethernet MAC address. Initially, MACn contains no valid value, until a Serial command reads in a serial number. Serial number is then translated to MAC addresses if the UUT is Ethernet associated, and the MAC address(es) are stored in MAC1, MAC2, MAC3, etc. If there is only one MAC address associated with the specified UUT, then only MAC1 is valid. To see the currently stored MAC address(es) from the debug prompt, type .MAC1. To write MAC1 to a UUT product via RS232: RS2320 COM1".MAC1. Accessing an invalid MACn Variable causes an error message. No parameters.

<Macro Name>
Interprets the commands in the specified macro file. Parameters:
<Macro Name> — Name of script file to process.

Char <variable name>
Creates a variable (with the specified variable name) that can hold an 8 bit value between 0 and 255. Parameters:
<variable name> — Name to give to variable.

Cls
Clear the test result screen. No parameters.

DataIn <data type>
Specifies the numeric type af data used for input from I/O sources such as RS232, GPIB, I/O cards, etc. Parameters:
<data type> — Data format to interpret (for example hex, decimal, binary).

DataOut <data type>
Specifies the numeric type of data used for output to I/O sources such as RS232, GPIB, I/O cards, etc. Parameters:
<data type> — Data format to interpret (for example hex, decimal, binary).

DBI <address> <bit> [<compare> <message> <result>]
Reads a bit from the digital I/O port, and then compares the value to <compare>. If the result = <result>, the message is displayed. Parameters:
<address> — Address of the digital port to read the bit frorn.
<bit> — Specifies the individual bit.
<compare> — Bit state expected.
<message> — Generic message.
<result> — Generic result.

DBLOGSN <csn>
Used to tie a board's serial number to a MAC address created using a chip serial number (csn). Parameters:
<csn> — Chip serial number used to find the mac address. (Part number, seriai number, etc. are automatically retrieved from memory).

DBO <address> <bit> <state>
Set specified bit to specified state at the address specified. Parameters:
<address> — Address of the digital port to write the bit to.
<bit> — Specifies the individual bit to be changed.
<state> — Specifies the state (1 or 0) to set the specified bit to.

Debug
Places the host software in debug mode, to allow entry of commands from the keyboard. No parameters.

TABLE 1-continued

MACRO COMMANDS

Decide <prompt> <yes> <no> [<message> <result>]
Displays a prompt in a dialog box with <yes> and <no> buttons. The <yes> button returns a "P" and <no> returns an "F". If the return character = <return>, the message is displayed. Parameters:

| | |
|---|---|
| <prompt> | Text message to display. |
| <yes> | Text label for Yes button. |
| <no> | Text label for No button. |
| <message> | Generic message |
| <result> | Generic result |

Define <macro name> [<var type> <var name> . . .] (Returns <var type> <var name>]
Defines a macro function argument and return value. For example, a macro that takes one integer value and returns one integer value would be defined by:
Define GetValue int InValue returns int OutValue.
Parameters:

| | |
|---|---|
| <macro name> | The name of the macro which is being defined. |
| <var type> | The type of a local variable to be passed to or returned by the macro. |
| <var name> | The name of a local variable to be passed to or returned by the macro. |

Delete <variable>
Deletes a variable that was created earlier with int, char, float, string, or pointer. Parameters:

| | |
|---|---|
| <variable> | Variable name contained in quotes (for example: Delete "Checksum"). |

Delay <seconds>
Delays execution for the specified number of seconds. Parameters:

| | |
|---|---|
| <seconds> | Delay time interval, in seconds. |

DO <address> <byte>
Outputs a byte to a digital I/O port. Parameters:

| | |
|---|---|
| <address> | Address of the digital port to write the byte to. |
| <byte> | Eight bit hex value to be written to the port. |

DOPE <address>
Digital Output Port Emulator. This command is designed to ease the digital single bit output when using the DBO command where the actual hardware output port does not allow read-back. For an output that does not allow read-back, first process the command DOPE 300, and then later DBO 300 2 1 (sets bit 2 of port 300 to a 1). DOPE simply creates a char type variable, uses it to set the specified bit while not destroying other bits when the command DBO is interpreted, and then writes the full contents of this variable to the output. Parameters:

| | |
|---|---|
| <address> | Output port address. |

DPI <address> {<pattern> <mask> >message> <result>]
Digital Pattern Input. Reads a byte from the digital I/O port, masks the value, and then compares the value to <pattern>. If the result = <result>, then the message is displayed. Parameters:

| | |
|---|---|
| <address> | Address of the digital port to write the byte to. |
| <pattern> | Expected range or value of the return value (for example "4.95 5" or "5.00"). |
| <message> | Generic message |
| <result> | Generic result |

DVI <address> [<range> <message> <result>]
Digital Value Input. Reads a byte from the digital I/O port, and then compares the value to <range>. If the result = <result>, the message is displayed. Parameters:

| | |
|---|---|
| <address> | Address of the digital port to write the byte to. |
| <range> | Expected range or value of the return value (for exampie "4.95 5" or "5.00"). |
| <message> | Generic message |
| <result> | Generic result |

TABLE 1-continued

MACRO COMMANDS

Else
Marks the start of an execution block which will be processed if no conditionai statement of an If command is met. No parameters.

Else if <value> <condition> <value>
Marks an execution block to be processed if <condition> is met and no prior condition in the If command was met. Parameters:

| | |
|---|---|
| <value> | A value to operate on (can be a string or a number). |
| <condition> | Condition to test for. (valid conditions are ==, !=, >, <, >=, <=). |
| <value> | Other value to operate on (can be a string or a number). |

End
Marks the end of the program. The program will stop after this command. No parameters.

Endif
Marks the end of an if statement block. This is required to end an if block. No parameters.

Exit
This command will exit from the validation mode or the debug mode, when processed from within one or the other. No parameters Fail <message>
Forces a macro to fail and to return the specified message. Parameters:

| | |
|---|---|
| <message> | Message to display, describing a failure. |

Float <variable name>
Creates a variable with the specified variable name, which can hold a floating-point value. Parameters:

| | |
|---|---|
| <variable name> | Variable name. |

Ftpdnl <identifier> <variable>
A board number, a revision number, and the specified identifier are used to search the Programmable Part Database for a matching record, which will provide the name of a file transfer protocol (FTP) configuration file, and checksum information. The configuration file is retrieved to obtain configuration information, including the name of a file containing binary information, which is downloaded into a programmable device. This command does not verify checksum information, but instead returns the checksum information in the specified variable, so that the calling routine can optionally do a verification. Parameters:

| | |
|---|---|
| <identifier> | Identifier for search. |
| <variable name> | Name of variable to hold checksum information. |

GetBoardCount
Returns the number of boards that are currently being tested. This number is determined by the number of boards that have been scanned using the Serial command or the normal scan. No parameters.

Getchar <string> <position>
Returns the character at the specified position in the specified string. Parameters:

| | |
|---|---|
| <string> | String to retrieve the character from. |
| <position> | An index identifying the position of the character in the string (where the first character is "0"). If this number is greater than the string length, the function will return the number "0". |

GetChecksum <IC name>
Returns the checksum for the specified IC name. This function looks up the record in the programmable parts database according to its part number, revision number, and the IC name. Parameters:

| | |
|---|---|
| <IC name> | Name of IC for checksum |

GetSerialNum <index>
Returns the serial number of the board that is referred to by the index. Parameters:

TABLE 1-continued

| MACRO COMMANDS | |
|---|---|
| <index> | Index of the board to retrieve the serial number from. |
| GetStringAt <string> <pos> | |
| Returns a copy of the string at the offset position. Parameters: | |
| <string> | String to copy the text from. |
| <pos> | Zero-based index position indicating where to start copying. Copying will stop when the function reaches the end of string. |
| GetTestName | |
| Returns the test name of the macro that is currently running. No parameters. | |
| Global <var type> <var name> [=<var value] | |
| This command makes a variable declaration into a global declaration. Global variables remain in memory until they are deleted, or until the program ends. Parameters: | |
| <var type> | Type of a variable to be declared global. |
| <var name> | Name of a variable to be declared global. |
| <var value> | Value to load into the specified global variable. |
| GoTo <label> | |
| Causes execution to begin on the line immediately following the line containing the specified <label>. Parameters: | |
| <label> | Text label at destination line. |
| GPIBO <address> <string> | |
| Outputs specified <string> to the specified <address> of the GPIB bus. Parameters: | |
| <address> | GPIB address of the device. |
| <string> | Output string. |
| GPIBSI <address> [<compare> <message> <result>] | |
| Receives a string from the specified <address> of the GPIB bus, and optionally compares it to [compare]. If the compare result matches <result>, then the <message> is displayed. Parameters: | |
| <address> | GPIB address of the device. |
| <compare> | String pattern expected to be returned. |
| <message> | Generic message. |
| <result> | Generic result. |
| GPIBSU <address> [<compare> <message> <result>] | |
| Waits for string from the specified <address> of the GPIB bus, and optionally compares it to <compare>. Execution will not continue until a received string matches <compare>. If a time-out occurs and <result> = F or A, then <message> will be displayed. It the compare is met and <result> = P, then the message will be displayed. Parameters: | |
| <address> | GPIB address of the device. |
| <compare> | String pattern expected to be returned. |
| <message> | Generic messaye. |
| <result> | Generic result. |
| GPIBSXI <address> <message> | |
| GPIB String X (don't care) Input. Gets the next string (up to a new line) from the GPIB. If <message> is present and has tilde (~), the tilde is replaced with the string read from the GPIB, and is displayed. Parameters: | |
| <address> | GPIB device |
| <message> | ASCII message to be displayed. |
| GPIBVI <address> [<range> <message> <result>] | |
| Receives a value from the specified <address> of the GPIB bus, and optionally compares it to <range>. If the compare result matches <result>, then <message> is displayed. Parameters: | |
| <address> | GPIB address of the device. |
| <range> | Expected range or value (for example "4.95 5.05" or "5.00"). |
| <message> | Generic message. |
| <result> | Generic result. |
| GPIBVU <address> [<range> <message> <result>] | |

TABLE 1-continued

| MACRO COMMANDS | |
|---|---|
| Waits for value from the specified <address> of the GPIB bus, and optionally compares it to <range>. Execution will not continue until the range is met. If a time-out occurs and <result> is F or A, then <message> will be displayed. If the range is met and <result> = P then <message> will be displayed. | |
| <address> | GPIB address of the device. |
| <range> | Expected range or value for example "4.95 5.05" or "5.00"). |
| <message> | Generic message. |
| <result> | Generic result. |
| If <valuel> <condition> <value2> | |
| Marks an execution block, which is processed if <condition> is met for the two values. Execution of the block stops when an Else, Elseif, or Endif is reached. (Note: this command requires that an "endif" statement be placed to mark the end of the block) Parameters: | |
| (value1) | A first value to operate on (can be a string or a number). |
| <condition> | condition to test for. (Valid conditions are ==, !=, >, <, >=, <=). |
| <value2> | A second value to operate on (can be a string or a number). |
| Int <variable name> | |
| Creates a variable with the specified variable name, which can hold a 32-bit integer value. Parameters: | |
| <variable name> | Variable name. |
| LatPrg <identifier> | |
| A board number, a revision number, and the specified identifier are used to search the Programmable Part Database for a matching record, which will provide the name of a lattice configuration file, and checksum information. The configuration file is retrieved to obtain configuration information, including the name of a file containing binary information, which is downloaded into a lattice device. A checksum is performed on the resulting information in the device, and compared to the checksum information from the database. Parameters: | |
| <identifier> | Identifier for search. |
| LeftTrim <string> | |
| Removes white spaces from the left end of the specified <string>. Parameters: | |
| <string> | String from which white spaces are to be removed. |
| LoadModule <module> | |
| Loads an object moduie tor execution. The object can be a compiled OBJ file, or a DLL. For the DLL the import, LIBRARY.LIB must be specified. A loaded module may be executed by just typing its name. Arguments can be passed to the object module by listing them as normal parameters for a macro. (For example, the module for dport is loaded by the command: LoadModule "dport.lib"). Parameters: | |
| <module> | Name of the module to load (either the name of the OBJ file or the LIB file). |
| LookFor <string> <message> <result> | |
| This command tests for the existence of <string> within the RS232 character buffer. (For exampie, in response to the command: LookFor "COMPLD" "did not get compld" F, the system searches for "COMPLD" in the string buffer, and returns a fail if doesn't find it). Parameters: | |
| <string> | String to search for. |
| <message> | Generic message. |
| <result> | Generic result. |
| Loop <macro name> | |
| Interprets a macro in a continuous loop. The start button will change labels to "Stop Loop" during execution of this command. Clicking the Stop Loop button stops the loop. Useful for repair debugging purposes. Parameters: | |
| <macro name> | Name of a macro to interpret in a loop. |

TABLE 1-continued

MACRO COMMANDS

Macro <MacroName>

This command loads an editor for editing the specified macro (or for creating the macro if it doesn't already exist). Parameters:

| | |
|---|---|
| <MacroName> | Name of macro file to be edited or created. |

MacroDir [<dirName>]

Changes the directory from which macros are processed. Each board has its own macro directory. Parameters:

| | |
|---|---|
| <dirName> | Name of the directory to switch to for executing macros. (Optional - Specifying no directory will return the current directory). |

MacSplit <SplitString>

Specifies the string that will separate the different octets of the MAC address. (For example, the MAC address octects are separated by periods in response to the command: MacSplit "."). Parameters:

| | |
|---|---|
| <SplitString> | The string used to split the octects. |

MacAssign <Number>

Assign a number of MAC addresses specified by Number to the active part number, serial number combination. See the SelectMacro for selecting the active board (part number, serial number, etc.) Parameters:

| | |
|---|---|
| <Number> | Number of MAC addresses to assign to the current part number, serial number. |

Message <text>

Display <text> in a pop-up window, and wait for operator response. Parameters:

| | |
|---|---|
| <text> | ASCII characters to be displayed. |

Pass <text>

Prints <text> to the test output, followed by padding dots and the word PASS. This command gets ignored if any kind of "Continue on Fail" feature is enabled. Parameters:

| | |
|---|---|
| <text> | ASCII characters to be sent to test output. |

Return [<value>]

Returns from a macro. Execution of a macro will be stopped when it hits this command. Otherwise, execution runs until the file end. On macros that can return a value, <value> specifies the return value. Parameters:

| | |
|---|---|
| <value> | Value to return to the calling macro. |

RightTrim <string>

This command removes any white spaces from the right end of <string>. White spaces are the standard ANSI C white spaces, except space, tab, line feed, carriage return etc. Parameters:

| | |
|---|---|
| <string> | String from which to remove white spaces. |

RS232Close <port>

Closes the serial port, so that it can be used by other programs. Parameters:

| | |
|---|---|
| <Port> | Serial port to close. |

RS232Flush <port>

Flushes out the specified serial <port>. Parameters:

| | |
|---|---|
| <Port> | Serial communication port to flush |

RS232E0 <port> <text>

Outputs <text> to the specified <port>. This command outputs one character at a time, and waits until each character is echoed back before sending another character. Parameters:

| | |
|---|---|
| <port> | Serial communication port to which <text>is to be sent. |
| <text> | Data to be sent to <port>. |

RS2320 <port> <text>

Outputs <text>to the specified <port>. Parameters:

| | |
|---|---|
| <port> | Serial communication port to which <text> is to be sent. |
| <text> | Data to be sent to <port>. |

TABLE 1-continued

MACRO COMMANDS

RS232L1 <port> [<compare> message> <result>]

Receives a line from the specified serial <port>, and compares it to <compare>. It there is a match then <message> is displayed. A line ends at a line feed or carriage return character. Parameters:

| | |
|---|---|
| <port> | Serial communications port from which to receive a line. |
| <compare> | String value expected to be returned. |
| <message> | Generic message. |
| <result> | Generic result. |

RS232Set <port> <baud> <parity> <data> <stop>

Set the specified serial <port> with a new baud rate. Parameters:

| | |
|---|---|
| <port> | Serial communications port. |
| <baud> | Speed (use a standard value) |
| <parity> | O, E, or N for Odd, Even, or No parity. |
| <data> | Number of data bits (7 or 8). |
| <stop> | Number of stop bits (1 or 2). |

RS232S1 <port> [<compare> <message> <result>]

Receives a string from the specified serial <port>, and compares it to <compare>. If there is a match, then <message> is displayed. Parameters:

| | |
|---|---|
| <port> | Serial communications port from which to receive a string. |
| <compare> | Expected String value. |
| <message> | Generic message. |
| <result> | Generic result. |

RS232SU <port> <compare> [<message> <result>]

Waits for a string from the specified serial <port>, and compares it to <compare>. Execution will not continue until there is a match. If a time-out occurs and <result> = F or A, then <message> will be displayed. If there is a match and <result> = P, then <message> will be displayed. Parameters:

| | |
|---|---|
| <port> | Serial communication port from which to receive a string. |
| <compare> | Expected string value. |
| <message> | Generic message. |
| <result> | Generic result. |

RS232SXI <port> <message>

A string (up to a line) is read from the specified serial <port>. If the specified message has a tilde (~), the tilde in the message is replaced with the string, and the message is displayed. Parameters:

| | |
|---|---|
| <port> | Serial communication port from which to receive a string. |
| <message> | Message to be displayed. |

RS232V1 <port> <range> [<message> <result>]

Receives a value from the specified serial <port>, and compares it to <range>. If a value within <range> is received, then <message> will be displayed. Parameters:

| | |
|---|---|
| <port> | Serial communication port from which to receive a value. |
| <range> | Expected range or value (for example "4.95 5.05"). |
| <message> | Generic message. |
| <result> | Generic result. |

RS232VU <part> <range> [<message> <result>]

Waits for a value from the specified serial <port>, and compares it to <range>. Execution will not continue until a value within the <range> is received. If a time-out occurs and <result> = F or A, then <message> will be displayed. If a value within <range> is received and <result> = P, then <message> will be displayed. Parameters:

| | |
|---|---|
| <port> | Serial communication port from which to receive & value. |
| <range> | Expected range or value (for example "4.95 5.05"). |
| <message> | Generic message. |
| <result> | Generic result. |

Run <exe name> <parameters> <Wait flag>

Executes the specified executable, and passes the <parameters> to it. Parameters:

TABLE 1-continued

MACRO COMMANDS

| | |
|---|---|
| <exe name> | Executable file to run. |
| <parameters> | Parameters to pass to EXE command line. |
| <Wait flag> | Wait flag. (Choices are "WAIT" and "DON'T WAIT") |

RunModule <module> <parameters>

Executes a previously loaded module, and passes the <parameters> to it. Parameters:

| | |
|---|---|
| <exe name> | Executable module to run. |
| <parameters> | Parameters to pass to module entry function. |

SelecBoard <number>

Makes the board specified by the index <number> the active board. The active board's vital information is copied into the current buffers. Any commands that are specific to a part number or serial number require that a board be set to be the active board. If there is only one board being tested, this command does not need to be processed, because that board is selected automatically. Parameters:

| | |
|---|---|
| <number> | The board number index to make active. |

Serial

Prompts the operator to scan the UUT's serial number into the system. This serial number then causes the system to scan the MAC table and determine if this serial number requires an x number of ethernet MAC addressees. It then stores the required MAC addresses) to the .MACn. variable in the script environment (see MACn. command). No parameters.

SetSerialStatus <index> <status>

Sets the status of the board specified by <index> on a multiple board test. The status is the pass or fail condition (0 for pass, 1 for fail). Parameters:

| | |
|---|---|
| <index> | Index of the board to have status set. The serial number list is a zero-based index (the first board is index 0). |
| <status> | Status (0 for pass, 1 for fail) |

SetActiveComport <port>

Sets the active seriai <port> so that an external module can retrieve this information. Parameters:

| | |
|---|---|
| <port> | Serial port to be set as active. |

Sprintf <varname> <parameters>

The Sprintf function formats the <parameters> and copies them to the variable <varame>. (For example, the variable Var will contain "my string1" after execution of: Sprintf "var" "my string" 1). Parameters:

| | |
|---|---|
| <vamame> | The name of a valid variable, in quotes. The variable must be a string function. |
| <parameters> | Parameters to format into the variable <varname>. Parameters are copied and appended one atter the other. |

Status <text>

Displays <text>on the operating system status line. Parameters:

| | |
|---|---|
| <text> | ACSII text string to display. |

StartLog

Enables logging of failure data to a log file. This command is usually used sometime after StopLog has been used, in order to resume logging of the pass-fail data. No parameters.

StopLag

Disables logging of failure data to a log file. This command is usually used in order to do some debugging commands for which logging is not desirable. No parameters.

String <name>

Creates a string variable. A string can contain characters that are NULL (0) terminated. Parameters:

| | |
|---|---|
| <name> | Name of string variable. |

Sync

Stops execution until an external executable has reported that the system can continue, or until that external executable has ended. The command synchronizes execution between the system and the external executable. No parameters.

Terminal <port> <add linefeed>

Places the system into a terminal mode using the specified serial <port>. Any characters received from <port> will be displayed on the test result box. Any characters typed from the keyboard while the test result box is active will be sent to the serial port. Parameters:

| | |
|---|---|
| <port> | Specifies a serial port. |
| <add linefeed> | Controls whether to append a line feed to each carriage return (1 to append, 0 not to append). |

TimeOut <seconds>

Sets the maximum time allowed for a test to complete. Parameters:

| | |
|---|---|
| <seconds> | Time, in seconds, to allow the test to complete. |

Text <text>

Displays <text> to test result output. Parameters:

| | |
|---|---|
| <text> | ASCII characters to be printed to test output. |

TST <test name>

Sets the test name for the current execution block. Parameters:

| | |
|---|---|
| <test name> | The test name to assign to the current execution block. The test name is automatically printed out in the result screen it the test passes or fails. (Automatically means it is not necessary to use the Pass command or Fail command). The test name is also the name of the test that is logged to the test log file. |

UnloadModule <module>

Unloads a specified module name from memory. The module can no longer be executed: Parameters:

| | |
|---|---|
| <module> | The name of the module to remove from memory. |

Userinput <message>

Brings up a dialog box which requests that the operator input information. The <message> is displayed and the string input by the operator is returned. Parameters:

| | |
|---|---|
| <message> | Message to display. |

Validation

Turns validation on or off, to validate the software. No parameters.

Wait <text>

Displays <text> in a pop-up window, and continues. The message can be cleared by issuing the Wait command with . . . (NULL Terminator) as the test. Parameters:

| | |
|---|---|
| <test> | An ASCII message to be displayed. |

Note - Unprintable Characters

Some ASCII characters are unprintable. The following are shortcut notations which can be used in strings to represent these characters:

- ■ Backspace
- Formfeed
- Linefeed
- [r] Carriage return
- Tab (horizontal)
- | Vertical tab
- [\] Backslash
- [|]mJ Single quote (apostrophe)
- [|]mK Double quote
- ¿ Question mark
- Ø O = String of up to three octal digits
- ×H H = String of hex digits Note - Valid Mathematical / Boolean Operators The following is a list of valid mathematical and Booean operators. Any operator can be followed by the equal operator to combine its operation and the equal operation. (For example, >= means greater than TABLE 1-continued

MACRO COMMANDS

```
or equal to).
+    Add
-    Subtract
*    Multiply
/    Divide
>    GreaterThan
<    Less Than
!    logical Not Operator
|    logical OR Operator
&    logical AND Operator
=    Equal
==   Equal to
!=   Not Equal
```

TABLE 2

PROGRAM FILE (3MR1.PRG)

```
; This macro tests an optical board.
InitializeEquipment ; macro to set up test equipment
TST "Firmware Download Test"
FirmwareDownloadTest ; download firmware to lattice
devices.
Instruct operator to plug in the optical cable.
Message "Connect the optical cable as shown in the
picture." "Optical.BMP"
TST "Optical Power Output Test"
OpticalPowerTest ; run optical power test macro
TST "Physical Inventory Test"
PhysicalInventoryCheck ; test physical inventory
EEPROM.
TST "Memory Access Test"
MemoryTest
TST "Power Consumption Test"
PowerConsumptionTest
TST "Production Software Download Test"
ProdSoftwareDownload
ShutDown ; De-initialize equipment - testing done.
Message "DisConnect the optical cable as shown in the
picture." "DisOpt.BMP"
```

TABLE 3

MACRO (InitializeEquipment.MAC)

```
; Initialize test equipment to a known configuration.
Power "ON" ; turn on power supply to test board.
; Set up the optical power meter instrument.
Gpibo 712 "POWER:WAV 1310"
Gpibo 712 "POWER:REF AUTO"
Gpibo 712 "POWER:ATT ODB"
Gpibo 712 "POWER:LEVEL AUTO"
Gpibo 712 "POWER:CLOCK INT"
Setup the optical attenuator.
Gpibo 713 "D01" ; enable optical attenuator
Gpibo 713 "ATT 0 DB" ; set initial attenuation (0 dB)
; Initialize the fixture cpu.
Rs232set 1 9600 n 8 1 ; Set up serial port.
Rs232o 1 "\x1b"
; Fail if the test fixture tails to initialize.
Rs232su 1 "DD>" "Test Fixture is not responding!" F
```

TABLE 4

MACRO (Power.MAC)

```
define Power string flag return int status
if flag=="ON"
    Gpibo 702 "VSET 5V" ; Set up power supply at 5V
    Gpibo 702 "IOUT 1A ; Set current to 1 amp
```

TABLE 4-continued

MACRO (Power.MAC)

```
    Gpibo 702 "VOUT 1" ; Enable power supply output
else if flag=="OFF"
    Gpibo 702 "VSET 5V" ; Set up power supply at 5V
    Gpibo 702 "IOUT 1A ; Set current to 1 amp
    Gpibo 702 "VOUT 0" ; Enable power supply output
endif
```

TABLE 5

MACRO (FirmwareDownloadTest.MAC)

```
int var
var =latprg "IC34" ; Programming Lattice device
if var == 0
    PASS "Firmware Download Test"
else if var == 2
    Message "Database File Read Error!! Possible
    Corrupted Table!! \n Contact Mfg. Engineering!"
    FAIL "Firmware Download Test"
else if var == 3
    Message "Checksum Error!! Device checksum does not
    match database!"
    FAIL "Firmware Download Test"
else if var == 4
    Message "Program Error!! Unknown Error ocurred
    while programming!
    FAIL "Firmware Download Test"
else if var == 9
    Message "Lattice Programming Aborted! Record not
    found for IC34 in database! \n Possible Revision
    Update Needed! Contact.Mfg. Engineering!"
    FAIL "Firmware Download Test"
else if var == 10
    Message "Timeout Occured While Programming!"
    FAIL "Firmware Download Test"
else
    Message "Unknown Error Occurred!!"
    FAIL "Firmware Download Test"
endif
```

TABLE 6

MACRO (OpticalPowerTest.MAC)

```
float OpticalPower
OpticalPower= MeasureOPticalPower
if OpticalPower > 0.5
    Fail "Optical Power Test\nThe Optical power is
    too high"
endif
if OpticalPower < -15.0
    Fail "Optical Power Test\nThe Optical power is
    too low"
endif
Pass "Optical Power Test"
```

TABLE 7

MACRO (MeasureOpticalPower.MAC)

```
define MeasureOPticalPwer return float value
int error
string TestName
TestName=GetTestName ; what test is now running?
Gpibo 712 "READ:POWER?" ; Notify instrument of read.
value=GpibVi 712 ; read power from instrument.
Gpibo 712 "SYSTEM:ERROR?" ; ask instrument re errors.
error=Gpibsi 712
if error!=0
    string failmsg
```

TABLE 7-continued

MACRO (MeasureOpticalPower.MAC)

```
    sprintf "failmsg" TestName "\nThere was an error
    while reading the power supply!\n"
    Fail failmsg
endif
return value
```

TABLE 8

MACRO (PhysicalInventoryCheck.MAC)

```
; load external library to do cpu-intensive work.
loadmodule "PhyInv.LIB"
; call the module with the UUT connector name.
int result
result=phyinv "1-W"
if result==1
    Fail "Physical Inventory Test\nThe physical
    inventory is not correct!"
else
    Pass "Physical Inventory Test"
endif
```

TABLE 9

MACRO (MemoryTest.MAC)

```
; load external library to do cpu-intensive work.
loadmodule "MemTest.LIB"
int result
string failmsg
; Call the module with teh UUT connector name.
; Pass variable "failmsg" for return of failure data.
result=memtest "1-W" "failmsg"
if result==1
    string failstr
    srintf "failstr" "Memory Access Test\n" "There
    was a memory mismatch in the following
    locations!\n" failmsg
    Fail falistr
else
    Pass "Memory Access Test"
endif
```

TABLE 10

MACRO (PowerConsumptionTest.MAC)

```
float value
Gpibo 702 "ICURR?" ; ask power supply for current.
value=Gpibvi 702 ; read current from power supply.
if value > 1.5 ; Too much current (>1.5 amps)?
    Fail "Power Consumption Test\nThe Optical board
    is drawing excess current!"
endif
if value ≦ 0.5 ; Too little current (≦0.5 amps)?
    Fail "Power Cosumption Test\nThe Optical board
    is drawing below average current"
endif
Pass "Power Consumption Test"
```

TABLE 11

MACRO (ProdSoftwareDownload.MAC)

```
Status "Downloading Production program into FLASH . . . "
int checksum
int var
var = ftpdnl "IC3,IC4" "checksum"
```

TABLE 11-continued

MACRO (ProdSoftwareDownload.MAC)

```
if var == 0
    PASS "Production Software Download Test"
else if var == 2
    Message "Database File Read error!! Possible
    Corrupted Table!! \n Contact Mfg. Engineering!"
    FAIL "Production Software Downlaod Test\nFTP
    Download"
else if var == 4
    Message "Program Error!! Unknown Error ocurred
    while prgramming!"
    FAIL "Production Software Download Test\nFTP
    Download"
else if var == 9
    Message "Flash Programming Aborted. Record not
    found for IC3, \IC4 in database! \n Possible
    Revision Update Needed! Contact Mfg. Engineering!"
    FAIL "Production Software Download Test\nFTP
    Download"
else if var == 10
    Message "Timeout Occured While Programming!!"
    FAIL "Production Software DOwnload Test\nFTP
    Download"
else
    Message "Unknown Error Occurred!!"
    FAIL "Production Software Download Test\nFTP
    Download"
endif
```

TABLE 12

MACRO (Shutdown.MAC)

```
; De-initialize equipment (turn the power off).
Power "OFF"
```

TABLE 13

```
    .
    .
[BOARDS]
H16B-1023-H362=3MR1
    .
    .
[3MR1]
BoardName=HC1A-3MR1
ProgramFile=3MR1.PRG
MacroDir=MACRO
ProgramDir=PROGRAMS
RequireRevision=YES
    .
    .
```

TABLE 14

Programmable Device Database (Excerpt)

| | | | | | |
|---|---|---|---|---|---|
| . | | | | | |
| . | | | | | |
| H16B-1023-H362 | 002A | IC34 | OptBd.LAT | 05FE | F97D |
| . | | | | | |
| . | | | | | |
| H16B-1023-H362 | 002A | IC3,IC4 | OptBd.FTP | 0A93 | C5F4 |
| . | | | | | |
| . | | | | | |

TABLE 15

| LAttice Configuration File (OptBd.LAT) |
| --- |
| 1032E pv prgdevs\7503H999.jed |

TABLE 16

| FTP Configuration File (OptBd.FTP) |
| --- |
| ;FLM APU2 Flash Download<br>[Connect]<br>Host=167.254.122.136<br>User=none<br>Passwd=none<br>[Transfer]<br>LocalFile=c:\HostSoft\7503h095.lzs<br>RemoteFile=fl_II_ap.lzs |

TABLE 17

| Macro File Excerpt |
| --- |
| [Command Group A]<br>If SampleBase=1<br>[Command Group B]<br>EndIf |

What is claimed is:

1. An apparatus, comprising a test station which includes:

a coupling portion operative to facilitate a detachable operative coupling of said test station to a unit to be tested;

a memory portion which stores a program and a test file, said test file containing a test definition which specifies at least one test operation to be carried out by said test station through said coupling portion, said test definition being in the form of at least one command which is in an operator perceptible, uncompiled format; and a processor portion operatively coupled to said memory portion and said coupling portion, said processor portion being operative to execute said program, and said program causing said processor portion to access said test file and to process commands in said test file in an interpretive manner so as to cause said test definition to be carried out.

2. An apparatus according to claim 1, wherein said program has a selectively actuatable mode in which said program causes said processor portion to permit an operator to edit said test definition in said test file.

3. An apparatus according to claim 2, including a server which is operably coupled to said test station an d which stores a copy of said test file, wherein changes made to said test definition are stored only in said test station rather than said server.

4. An apparatus according to claim 1, wherein said program has a selectively actuatable step mode in which said program causes said processor portion to require operator approval before initiating interpretative processing of commands in said test file.

5. An apparatus according to claim 4, wherein said program maintains a variable which is used by said test definition, and wherein said program causes said processor portion to permit an operator to view said variable.

6. An apparatus according to claim 5, wherein said program causes said processor portion to permit an operator to selectively change said variable.

7. An apparatus according to claim 6, wherein said variable contains information received by said processor portion through said coupling portion during interpretative processing of said test definition.

8. An apparatus according to claim 5, wherein said variable contains information received by said processor portion through said coupling portion during interpretative processing of said test definition.

9. An apparatus according to claim 1, wherein said program causes said processor portion to permit an operator to selectively specify one said command in said test file as a breakpoint, so that when said processor portion thereafter encounters said one command during said interpretative processing, said processor portion automatically halts said interpretative processing.

10. An apparatus according to claim 1, wherein said memory portion stores a further file containing a further test definition which specifies at least one test operation to be carried out by said test station through said coupling portion, said further test definition being in the form of at least one command which is in an operator perceptible, uncompiled format, and wherein said test file includes a predetermined command which causes said processor portion to interrupt interpretative processing of said test definition in said test file, to interpretively process said further test definition in said further file, and to then resume interpretative processing of said test definition in said test file at a point following said predetermined command.

11. An apparatus according to claim 1, wherein said memory portion includes a further file containing a further test definition which is compiled, and which specifies at least one test operation to be carried out by said test station through said coupling portion, said test file including a predetermined command which causes said processor portion to interrupt interpretative processing of said test definition in said test file, to process said further test definition in a non-interpretative manner, and to then resume interpretative processing of said test definition in said test file at a point immediately following said predetermined command.

12. An apparatus according to claim 1, wherein said test definition in said test file includes first and second commands, wherein said program is operative to cause said processor portion to operate in one of a first mode and a second mode selected by an operator, wherein in said first mode said processor portion interpretatively processes each of said first and second commands, and wherein in said second mode said processor portion interpretatively processes one of said first and second commands to the exclusion of the other thereof.

13. An apparatus, comprising a test station which includes:

a coupling portion operative to facilitate a detachable operative coupling of said test station to a unit to be tested;

a memory portion which stores a program and a test definition, said test definition including a first portion and a second portion, said first portion specifying a first test operation to be carried out by said test station through said coupling portion and said second portion specifying a second test operation to be carried out by said test station through said coupling portion; and a processor portion operatively coupled to said memory portion and said coupling portion, said processor portion being operative to execute said program, wherein said program causes said processor portion to permit an operator to selectively specify one of a first operational mode and a second operational mode, and causes said processor portion to access and process said test definition, wherein in said first operational mode said processor portion processes both said first portion and said second portion of said test definition so as to carry out both of said first and second test operations, and wherein in said second operational mode said processor portion processes only said first portion of said test definition to the exclusion of said second portion thereof so as to carry out only said first test operation without said second test operation.

14. An apparatus according to claim 13, wherein said memory portion stores a test file which contains each of said first and second portions of said test definition.

15. An apparatus, comprising a test station which includes:

a coupling portion operable to facilitate a detachable operative coupling of said test station to a unit to be tested;

an output portion through which information can be communicated to an operator;

a memory portion which stores a test definition; and a processor portion operatively coupled to said coupling portion, said memory portion, and said output portion, said processor portion being operative in response to said test definition to use said output portion to successively communicate to an operator each of a plurality of different manual steps which are needed to carry out said test definition.

16. An apparatus according to claim 15, wherein said output device includes a video display, and wherein said test definition causes said processor portion to communicate one of said manual steps by displaying on said video display a graphic depiction of how to perform that respective manual step.

17. An apparatus according to claim 16, wherein said test definition causes said processor portion to display in conjunction with said graphic depiction a predetermined alphanumeric message.

18. An apparatus according to claim 15, including an input portion which is operatively coupled to said processor portion and through which an operator can communicate information to said test station, and wherein said test definition causes said processor portion to communicate one of said manual steps by displaying a request for an operator to provide specified input information through said input portion.

19. An apparatus according to claim 15, wherein said series of manual steps includes each manual step required of an operator in order to carry out said test definition.

20. An apparatus, comprising a test station which includes:

a coupling portion operable to facilitate a detachable operative coupling of said test station to a unit to be tested;

an output portion through which information can be communicated to an operator, said output portion including a video display;

a memory portion which stores a test definition; and a processor portion operatively coupled to said coupling portion, said memory portion, and said output portion, said processor portion being operative in response to said test definition to display on said video display a graphic depiction of how to perform a manual step required by said test definition.

21. An apparatus according to claim 20, wherein said test definition causes said processor portion to display in conjunction with said graphic depiction a predetermined alphanumeric message.

22. An apparatus according to claim 20, including an input portion which is operatively coupled to said processor portion and through which an operator can communicate information to said test station, and wherein said predetermined alphanumeric message includes a request for an operator to provide specified information through said input portion.

23. An apparatus, comprising: a test unit to be tested which has indicia thereon; and a test station which includes:

a coupling portion operative to facilitate a detachable operative coupling of said test station to said unit;

a reader portion which can read said indicia on said unit; and a control portion which is operatively coupled to said coupling portion and said reader portion, said control portion being responsive to information obtained through said reader portion from the indicia for carrying out through said coupling portion at least one operation which is selected as a function of said information;

wherein said control portion includes first and second test definitions, and wherein said operation carried out by said control portion is one of said first and second test definitions selected by said control portion using said information obtained through said reader portion.

24. An apparatus according to claim 23, wherein said reader portion includes a bar code reader, the indicia including a bar code.

25. An apparatus according to claim 23, wherein said coupling portion is operative to facilitate a detachable operative coupling of said test station to a selected one of the test unit and a further unit, the further unit having indicia thereon, said first and second test definitions being respectively selected in response to information from the indicia respectively on the test unit and the further unit.

26. An apparatus, comprising: a test unit to be tested which has indicia thereon; and a test station which includes:

a coupling portion operative to facilitate a detachable operative coupling of said test station to said unit;

a reader portion which can read said indicia on said unit; and a control portion which is operatively coupled to said coupling portion and said reader portion, said control portion being responsive to information obtained through said reader portion from the indicia for carrying out through said coupling portion at least one operation which is selected as a function of said information;

wherein said unit has a programmable part thereon, wherein said control portion includes a first programming definition and a second programming definition, and wherein said control portion acts through said coupling portion to cause said programmable part to be programmed with one of said first and second programming definitions which is selected by said control portion as a function of said information from said indicia on said unit.

27. An method of operating a test station which can be detachably operatively coupled to a test unit to be tested, comprising:

storing a test definition; and causing the test station to respond to the test definition by automatically carrying out on the test unit a sequence of test operations specified by the test definition, and by presenting on a display a graphic depiction of how to perform a manual step required by the test definition.

* * * * *

UNITED STATES PATENT AND TRADEMARK OFFICE

CERTIFICATE OF CORRECTION

PATENT NO. : 6,453,435 B1

DATED : September 17, 2002

INVENTOR(S) : Rogelio Limon, Jr. et al.

It is certified that error appears in the above-identified patent and that said Letters Patent is hereby corrected as shown below:

Column 2,
Line 15, after "bound" delete "."

Column 4,
Line 64, after "on" delete "title" and insert -- the --.

Column 6,
Line 13, the sentence beginning with "A further optical cable 97" should be incorporated with the previous paragraph ending with "detachably coupled to the UUT 13".
Line 59, after "112-114" the sentence beginning with "Each operator has an" should be the beginning of a new paragraph.
Line 66, after "of" delete "-".

Column 7,
Line 20, after "in" delete "conduction" and insert -- conjunction --.

Column 8,
Line 22, the sentence beginning with "References to the MAC" should be incorporated with the previous paragraph ending with "and which are referred to herein as MAC files".
Line 27, after "The" delete "3G".
Line 62, after "variable" the sentence beginning with "Table 2 sets" should be the beginning of a new paragraph.
Line 63, after "which" delete ",".

Column 13,
Line 27, after "command set" insert -- set --.

Column 14,
Line 1, after the first "such" insert -- as --.

Column 16,
Line 10, after "shown" delete "iii" and insert -- in --.

Column 17,
Line 13, after "transfer" delete ".".

Column 18,
Line 37, after "operator a" insert -- not --.

UNITED STATES PATENT AND TRADEMARK OFFICE
CERTIFICATE OF CORRECTION

PATENT NO. : 6,453,435 B1
DATED : September 17, 2002
INVENTOR(S) : Rogelio Limon, Jr. et al.

It is certified that error appears in the above-identified patent and that said Letters Patent is hereby corrected as shown below:

<u>Column 19,</u>
Line 12, after "a" delete "Step Modie" and insert -- Step Mode --.
Line 21, after "OVER" insert -- button --.

<u>Column 20,</u>
Line 16, delete "show" and insert -- shows --.
Line 17, after "additional" delete "window" and insert -- windows --.

<u>Column 21,</u>
Line 1, after "always be" delete "always be".

<u>Column 22,</u>
Line 55, after "number" delete "seriai" and insert -- serial --.

<u>Column 23,</u>
Line 14, delete "(" and insert -- [ --.
Line 47, after "<address>" delete "{" and insert -- [ -- and after "<mask>" delete ">message>" and insert -- <message> --.
Line 63, after "for" delete "exampie" and insert -- example --.

<u>Column 24,</u>
Line 7, after "no" delete "conditionai" and insert -- conditional --.
Line 14, after "are" delete "=="and insert -- = = --.
Line 50, delete "Getchar" and insert -- GetChar --.
Line 59, delete "GetChecksum" and insert -- GetCheckSum --.

<u>Column 25,</u>
Line 35, after "to" delete "[compare]" and insert -- <compare> --.
Line 54, after "has" insert -- a --.

<u>Column 26,</u>
Line 8, after "A" insert -- , --.
Line 11, before the word "for" insert -- ( --.
Line 20, after "block)" insert -- . --.
Line 21, delete "(value1)" and insert -- <value1> --.
Line 22, after "<condition>" delete "condition" and insert -- Condition --.
Line 43, after "object" delete "moduie" and insert -- module --.
Line 54, after "for" delete "exampie" and insert -- example --.

UNITED STATES PATENT AND TRADEMARK OFFICE

CERTIFICATE OF CORRECTION

PATENT NO. : 6,453,435 B1
DATED : September 17, 2002
INVENTOR(S) : Rogelio Limon, Jr. et al.

It is certified that error appears in the above-identified patent and that said Letters Patent is hereby corrected as shown below:

Column 27,
Line 19, after "address" delete "octects" and insert -- octets --.
Line 21, delete "octects" and insert -- octets --.
Line 35, after "of" delete "Continue on Fail" and insert -- Continue or Fail --.
Line 51, after "serial" delete "port" and insert -- <port> --.
Lines 53 and 55, delete "<Port>" and insert -- <port> --.

Column 28,
Line 7, after "<compare>" delete "It" and insert -- If --.
Line 17, after "valve)" insert -- . --.
Line 21, delete "RS232S1" and insert -- RS232SI --.
Line 44, delete "RS232V1" and insert -- RS232VI --.
Line 54, after "RS232VU" delete "<part>" and insert -- <port> --.
Line 60, after "receive" delete "&" and insert -- a --.

Column 29,
Line 14, delete "SelecBoard" and insert -- SelectBoard --.
Line 37, after "active" delete "seriai" and insert -- serial --.
Line 42, after "variable" delete "<varame>" and insert -- <varname> --.
Line 45, delete "<varame>" and insert -- <varname> --.
Line 49, after "one" delete "atter" and insert -- after --.
Line 53, delete "ACSII" and insert -- ASCII --.
Line 58, delete "StopLag" and insert -- StopLog --.

Column 30,
Line 29, delete "it" and insert -- if --.
Line 36, after "executed" delete ":" and insert -- . --.
Line 48, after "with" delete "..." and insert --
Line 54, delete "■" and insert -- \b --.
Line 54, before "Formfeed" insert -- \f --.
Line 55, before "Linefeed" insert -- \n --.
Line 56, delete "[r]" and insert -- \r --.
Line 57, before "Tab (horizontal)" insert -- \t --.
Line 58, delete "|" and insert -- \v --.
Line 58, delete "[\]" and insert -- \\ --.
Line 59, delete "[|]mJ" and insert -- \' --.
Line 59, delete "[|]mK" and insert -- \" --.
Line 60, delete "¿" and insert -- \? --.
Line 61, delete "Ø" and insert -- \O --.
Line 61, delete "xH" and insert -- \xH --.
Line 64, delete "Booean" and insert -- Boolean --.

UNITED STATES PATENT AND TRADEMARK OFFICE

CERTIFICATE OF CORRECTION

PATENT NO. : 6,453,435 B1 
DATED : September 17, 2002
INVENTOR(S) : Rogelio Limon, Jr. et al.

It is certified that error appears in the above-identified patent and that said Letters Patent is hereby corrected as shown below:

Column 31,
Line 14, delete "==" and insert -- = = --.
Line 26, insert -- ; -- before "Instruct".
Line 49, after "POWER:ATT" delete "ODB" and insert -- 0DB --.
Line 52, insert -- ; -- before "Setup".
Line 56, after "fixture" delete "tails" and insert -- fails --.
Line 64, after "flag" delete "==" and insert -- = = --.
Line 66, after "1A " insert -- " --.

Column 32,
Line 6, after "flag" delete "==" and insert -- = = --.
Line 8, after "1A" insert -- " --.
Lines 17, 19, 23, 26, 29 and 32, after "var" delete "==" and insert -- = = --.
Line 27, after "programming!" insert -- " --.
Line 33, after "Programming!" insert -- ! --.
Line 36, after "message" delete """ and insert -- “ --.
Line 45, after "=" delete "MeasureOPticalPower" and insert -- MeasureOpticalPower --.
Line 59, after "define" delete "MeasureOPticalPower" and insert
-- MeasureOpticalPower --.

Column 33,
Lines 19 and 35, after "result" delete "==" and insert -- = = --.
Line 32, after "with" delete "teh" and insert -- the --.
Line 37, delete "srintf:" and insert -- sprintf --.
Line 38, after "Fail" delete "falistr" and insert -- failstr --.
Line 54, after "valve" delete "$\underline{\underline{\angle}}$" and insert -- < -- and after "current" delete "$\underline{\underline{\angle}}$ 0.5" and insert -- (<0.5 --.
Line 55, after "Power" delete "Cosumption" and insert -- Consumption --.

Column 34,
Lines 5, 7, 12, 17 and 23, after "var" delete "==" and insert -- = = --.
Line 8, after "Read" delete "error" and insert -- Error --.
Line 14, after "while" delete "prgramming" and insert -- programming --.
Line 19, after "IC3" delete "\".
Line 25, after "Software" delete "DOwnload" and insert -- Download --.
Line 43, insert -- HostRun.INI --.

UNITED STATES PATENT AND TRADEMARK OFFICE

CERTIFICATE OF CORRECTION

PATENT NO. : 6,453,435 B1 
DATED : September 17, 2002
INVENTOR(S) : Rogelio Limon, Jr. et al.

It is certified that error appears in the above-identified patent and that said Letters Patent is hereby corrected as shown below:

Column 35,
Line 3, delete "LAttice" and insert -- Lattice --.
Line 51, after "station" delete "an d" and insert -- and --.
Line 57, delete "An" and insert -- A --.

Signed and Sealed this

Second Day of March, 2004

JON W. DUDAS
*Acting Director of the United States Patent and Trademark Office*